United States Patent
Pohlner et al.

(10) Patent No.: US 12,047,744 B2
(45) Date of Patent: Jul. 23, 2024

(54) ETCH STOP AND PROTECTION LAYER FOR CAPACITOR PROCESSING IN ELECTROACOUSTIC DEVICES

(71) Applicant: RF360 SINGAPORE PTE. LTD., Republic Plaza (SG)

(72) Inventors: Stephan Pohlner, Munich (DE); Christoph Eggs, Rattenkirchen (DE); Stefan Freisleben, Neubiberg (DE); Matthias Jungkunz, Munich (DE); Thomas Telgmann, Munich (DE); Marc Esquius Morote, Munich (DE); Ilya Lukashov, Munich (DE); Marcel Giesen, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 491 days.

(21) Appl. No.: 17/240,752

(22) Filed: Apr. 26, 2021

(65) Prior Publication Data
US 2022/0345828 A1    Oct. 27, 2022

(51) Int. Cl.
  *H04R 19/00*    (2006.01)
  *H04R 31/00*    (2006.01)

(52) U.S. Cl.
  CPC ......... *H04R 19/005* (2013.01); *H04R 31/006* (2013.01); *H04R 2499/11* (2013.01)

(58) Field of Classification Search
  CPC .................................................. H04R 19/005
  See application file for complete search history.

(56) References Cited

U.S. PATENT DOCUMENTS

| | | | | |
|---|---|---|---|---|
| 6,087,198 A | * | 7/2000 | Panasik | H03H 9/174 438/118 |
| 6,255,187 B1 | * | 7/2001 | Horii | H01L 21/2885 257/E21.175 |
| 6,384,697 B1 | * | 5/2002 | Ruby | H03H 3/02 333/187 |

(Continued)

FOREIGN PATENT DOCUMENTS

| JP | 2005311511 A | 11/2005 |
|---|---|---|
| JP | 2007317997 A | 12/2007 |

(Continued)

OTHER PUBLICATIONS

International Search Report and Written Opinion—PCT/EP2022/061009—ISA/EPO—Sep. 6, 2022.

*Primary Examiner* — William A Harriston
(74) *Attorney, Agent, or Firm* — Patterson + Sheridan LLP

(57) ABSTRACT

Electroacoustic devices with a capacitive element and methods for fabricating such electroacoustic devices. An example method includes forming an acoustic device above a first region of a substrate, and forming a capacitive element above a second region of the substrate and adjacent to the acoustic device. The forming of the capacitive element may include forming a protective layer above the substrate where a first portion of the protective layer is above the second region of the substrate and a second portion of the protective layer is above the first region of the substrate, forming a dielectric region above the protective layer, and forming an electrode above the dielectric region. The dielectric region may include a different material than the protective layer.

30 Claims, 26 Drawing Sheets

(56) References Cited

U.S. PATENT DOCUMENTS

| | | | | |
|---|---|---|---|---|
| 6,667,189 B1* | 12/2003 | Wang | | H04R 19/005 |
| | | | | 381/191 |
| 8,732,938 B2* | 5/2014 | Kolosov | | G01F 23/2966 |
| | | | | 29/609.1 |
| 9,193,583 B2* | 11/2015 | El-Gamal | | G01L 9/0042 |
| 9,254,997 B2* | 2/2016 | Cheng | | B81C 1/00238 |
| 9,537,465 B1* | 1/2017 | Shealy | | H03H 9/13 |
| 9,673,269 B2* | 6/2017 | Defay | | H01L 28/65 |
| 2002/0021192 A1* | 2/2002 | Klee | | H03H 9/581 |
| | | | | 333/202 |
| 2002/0090777 A1* | 7/2002 | Forbes | | H01L 21/02252 |
| | | | | 438/398 |
| 2003/0000058 A1* | 1/2003 | Tsai | | H03H 3/02 |
| | | | | 29/25.35 |
| 2003/0008467 A1 | 1/2003 | Kai et al. | | |
| 2003/0052355 A1* | 3/2003 | Jaouen | | G01L 9/0042 |
| | | | | 257/303 |
| 2004/0041256 A1* | 3/2004 | Takehara | | H01L 25/16 |
| | | | | 257/E23.105 |
| 2006/0170520 A1* | 8/2006 | Ha | | H03H 9/174 |
| | | | | 333/187 |
| 2007/0040270 A1* | 2/2007 | Coenen | | H01L 23/50 |
| | | | | 257/E23.079 |
| 2007/0164632 A1* | 7/2007 | Adachi | | G01N 29/2437 |
| | | | | 310/311 |
| 2009/0232334 A1* | 9/2009 | Feyh | | B81C 1/00246 |
| | | | | 381/174 |
| 2010/0164079 A1* | 7/2010 | Dekker | | H01L 24/16 |
| | | | | 257/E23.116 |
| 2015/0145610 A1* | 5/2015 | Ruby | | H03H 9/10 |
| | | | | 310/313 R |
| 2015/0357993 A1* | 12/2015 | Shealy | | H03H 9/54 |
| | | | | 310/321 |
| 2016/0028367 A1* | 1/2016 | Shealy | | H03H 3/02 |
| | | | | 438/51 |
| 2016/0028368 A1* | 1/2016 | Shealy | | H03H 3/02 |
| | | | | 310/346 |
| 2016/0190206 A1* | 6/2016 | Tsai | | H03H 9/171 |
| | | | | 257/416 |
| 2016/0304337 A1* | 10/2016 | Miao | | B81C 1/00158 |
| 2017/0217757 A1* | 8/2017 | Deas | | B81C 1/00246 |
| 2017/0264257 A1 | 9/2017 | Reinhardt et al. | | |
| 2018/0048290 A1* | 2/2018 | Sekine | | H03H 9/542 |

FOREIGN PATENT DOCUMENTS

| | | |
|---|---|---|
| JP | 2009010121 A | 1/2009 |
| KR | 20060078718 A | 7/2006 |

* cited by examiner

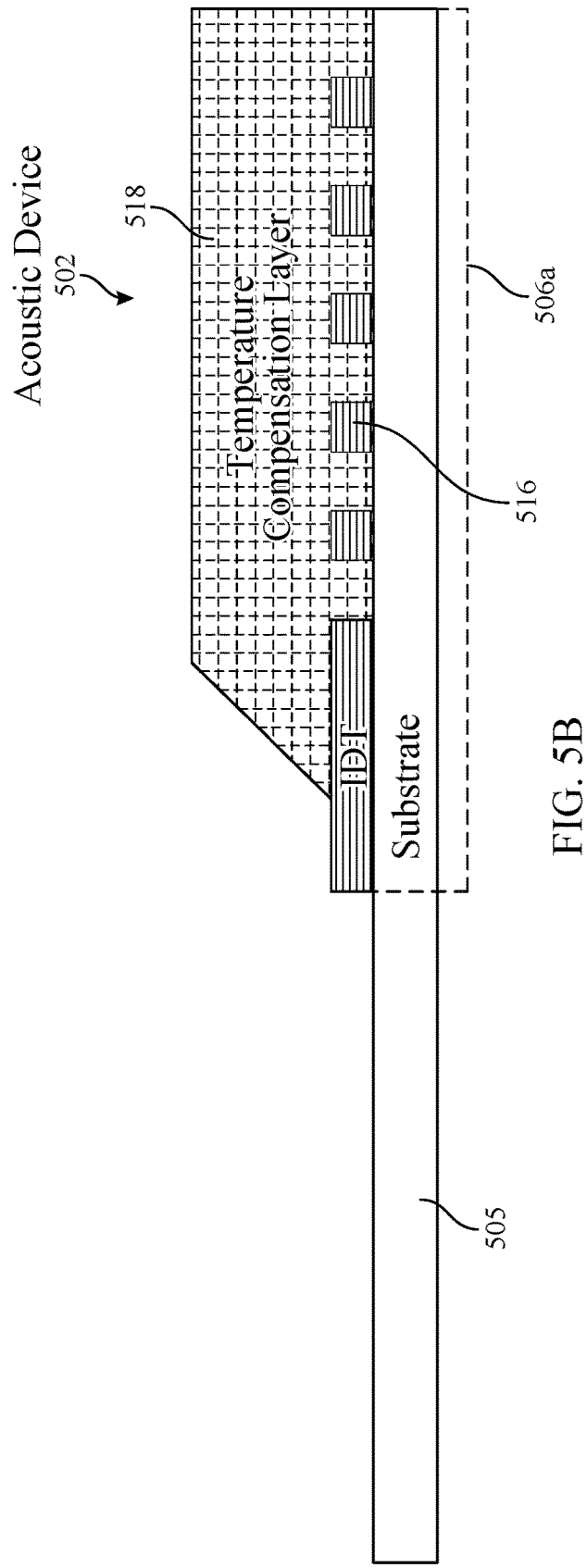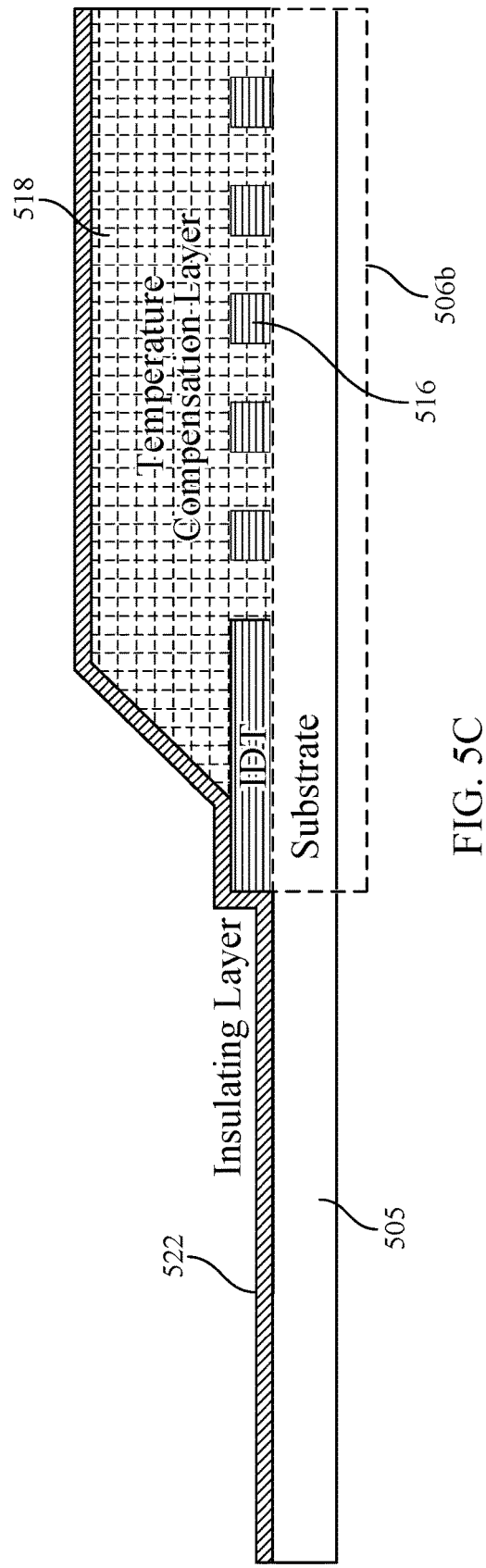
FIG. 5B
FIG. 5C

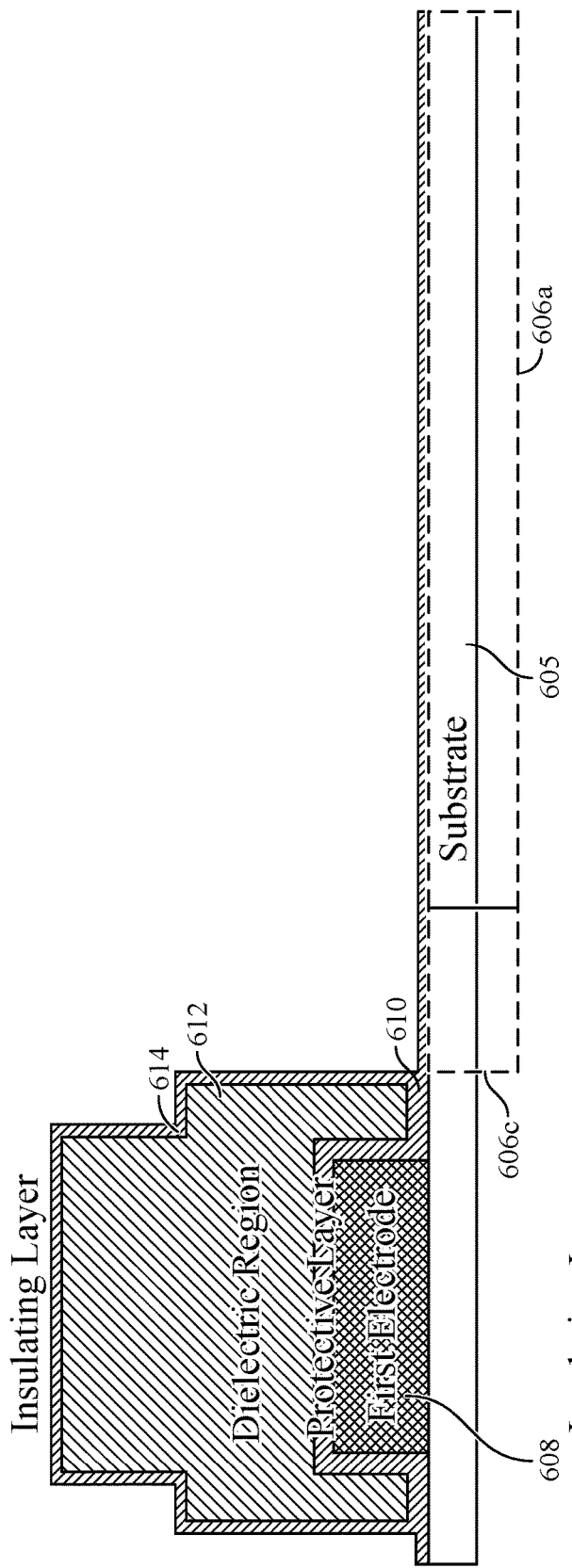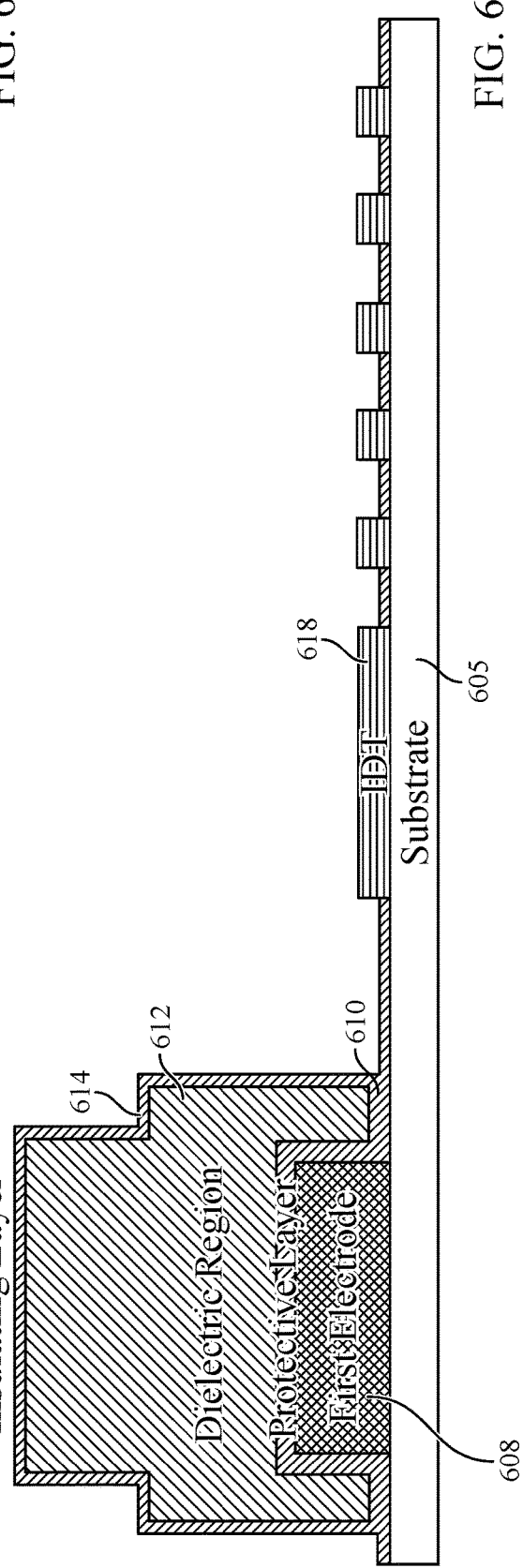

ETCH STOP AND PROTECTION LAYER FOR CAPACITOR PROCESSING IN ELECTROACOUSTIC DEVICES

BACKGROUND

Field of the Disclosure

Certain aspects of the present disclosure relate generally to electroacoustic devices and, more particularly, to electroacoustic devices implemented with capacitive elements.

Description of Related Art

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave propagating along an electrical conductor into an acoustic wave that is propagating via the piezoelectric material. The acoustic wave propagates at a velocity having a significantly lower magnitude than that of the propagation velocity of the electromagnetic wave. Generally, the magnitude of a wave's propagation velocity is proportional to a wavelength of the wave. Consequently, after conversion of an electrical signal into an acoustic signal, the wavelength of the acoustic signal is significantly smaller than the wavelength of the electrical signal wave. The resulting smaller wavelength of the acoustic signal enables filtering to be performed using a smaller filter device. This permits acoustic resonators to be used in electronic devices with size constraints, such as the electronic devices enumerated herein (e.g., including portable electronic devices such as cellular phones).

Today, surface acoustic wave (SAW) or bulk acoustic wave (BAW) components may be used in wireless communication devices, such as for implementing RF filters. In SAW technology, the acoustic wave propagates laterally on a surface of a piezoelectric substrate, with the movement of the piezoelectric being generated by metal interdigital transducers (IDTs) on the surface. The wavelength of the acoustic wave may be defined by the pitch (e.g., the width of the metal finger and gap) of the IDT. In BAW technology, the acoustic wave propagates vertically through a three-dimensional structure, with an electric field applied through electrodes above and below a piezoelectric material. The wavelength, in this case, is defined by the thickness of the piezoelectric material.

As the number of frequency bands used in wireless communication increases and as the desired frequency bands of filters widen, the performance of acoustic filters increases in importance to reduce losses and increase overall performance of electronic devices. Acoustic filters with improved performance, particularly filters with reduced intermodulation distortion, are therefore sought after.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include implementation of a capacitive element along with an acoustic device in an electroacoustic device.

Certain aspects of the present disclosure provide a method for fabricating an electroacoustic device. The method generally includes forming an acoustic device above a first region of a substrate, and forming a capacitive element above a second region of the substrate and adjacent to the acoustic device. The forming of the capacitive element includes forming a protective layer above the substrate where a first portion of the protective layer is above the second region of the substrate and a second portion of the protective layer is above the first region of the substrate, forming a dielectric region above the protective layer where the dielectric region includes a different material than the protective layer, and forming an electrode above the dielectric region.

Certain aspects of the present disclosure provide an apparatus for signal processing. The apparatus generally includes an acoustic device disposed above a first region of a substrate, and a capacitive element disposed above a second region of the substrate and adjacent to the acoustic device. The capacitive element generally includes a first electrode, a protective layer above the substrate where a first portion of the protective layer is disposed above the second region of the substrate, a dielectric region disposed above the protective layer and the first electrode where the dielectric region includes a different material than the protective layer, and a second electrode disposed above the dielectric region.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

FIGS. 5B-5J illustrate a fabrication process for an example electroacoustic device, such as the electroacoustic device of FIG. 5A, in accordance with certain aspects of the present disclosure.

FIGS. 6B-6L illustrate a fabrication process for an example electroacoustic device, such as the electroacoustic device of FIG. 6A, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figures 1A, 1B:
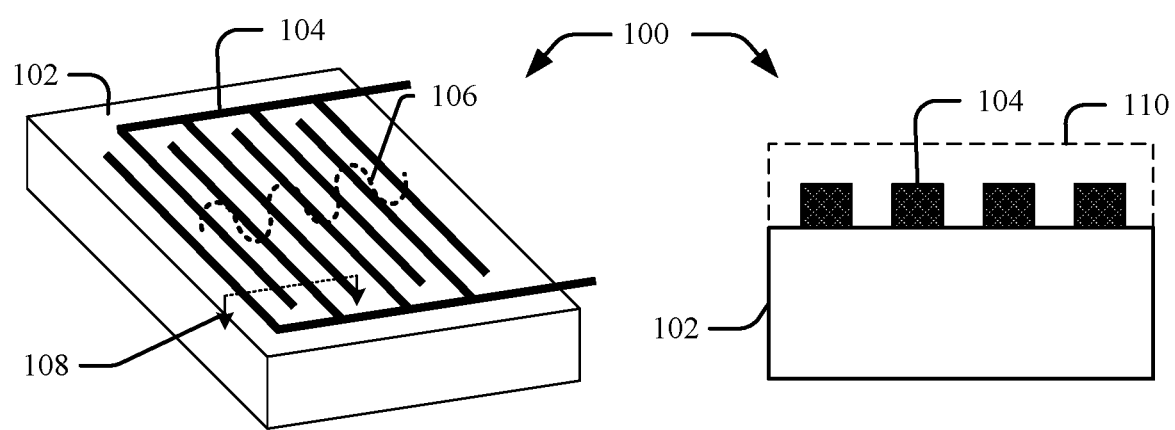
FIG. 1A is a diagram of a perspective view of an example electroacoustic device, in accordance with certain aspects of the present disclosure.
FIG. 1B is a diagram of a side view of the example electroacoustic device of FIG. 1A, in accordance with certain aspects of the present disclosure.

Certain aspects of the present disclosure generally relate to techniques for fabricating an electroacoustic device along with a capacitive element on a substrate using a protective layer. The electroacoustic device may be formed adjacent to the capacitive element. The electroacoustic device may be implemented as a surface acoustic wave (SAW) device or a bulk acoustic wave (BAW) device.

In some aspects, the protective layer may be deposited after forming an electrode of the capacitive element and prior to forming a dielectric region of the capacitive element. The protective layer may operate as an etch stop layer on the substrate, the electroacoustic device, or other underlying structures associated with the electroacoustic device during the dielectric region's etching process. At least a portion of the protective layer may be removed (e.g., using a wet chemical etch process) after the dielectric region's etching is complete. The wet chemical etch may have a negligible effect on the electroacoustic device's integrity or other underlying structures due to the implementation of the protective layer.

In some implementations, an acoustic layer may be deposited after the dielectric region's etching process is complete. In this case, the protective layer may prevent (or at least reduces the likelihood of) damage to the substrate (e.g., since without the protective layer, the substrate may be damaged due to forming of a capacitive layer that may influence acoustic performance).

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Example Electroacoustic Devices

FIG. 1A is a diagram of a perspective view of an example electroacoustic device 100. The electroacoustic device 100 may be configured as or be a portion of a surface acoustic wave (SAW) resonator. In certain descriptions herein, the electroacoustic device 100 may be referred to as a SAW resonator. However, there may be other electroacoustic device types that may be constructed based on the principles described herein.

The electroacoustic device 100 includes an electrode structure 104, that may be referred to as an interdigital transducer (IDT), on the surface of a piezoelectric material 102. The electrode structure 104 generally includes first and second comb-shaped electrode structures (conductive and generally metallic) with electrode fingers extending from two busbars towards each other arranged in an interlocking manner in between the two busbars (e.g., arranged in an interdigitated manner). An electrical signal excited in the electrode structure 104 (e.g., by applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

FIG. 1B is a diagram of a side view of the electroacoustic device 100 of FIG. 1A along a cross-section 108 shown in FIG. 1A. The electroacoustic device 100 is illustrated by a simplified layer stack including the piezoelectric material 102 with the electrode structure 104 disposed on the piezoelectric material 102.

The electrode structure 104 is electrically conductive and generally formed from metallic materials. The electrode structure 104 may alternatively be formed from materials that are electrically conductive, but non-metallic (e.g., graphene).

The piezoelectric material 102 may be formed from a variety of materials such as quartz, lithium tantalate (LiTaO$_3$), lithium niobate (LiNbO$_3$), doped variants of these, other piezoelectric materials, or other crystals. It should be appreciated that more complicated layer stacks including layers of various materials may be possible within the stack. For example, optionally, a temperature compensation layer 110 denoted by the dashed lines may be disposed above the electrode structure 104. The piezoelectric material 102 may be extended with multiple interconnected electrode structures disposed thereon to form a multi-resonator filter or to provide multiple filters.

While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip chip or other techniques) may also be included.

Figure 2A:
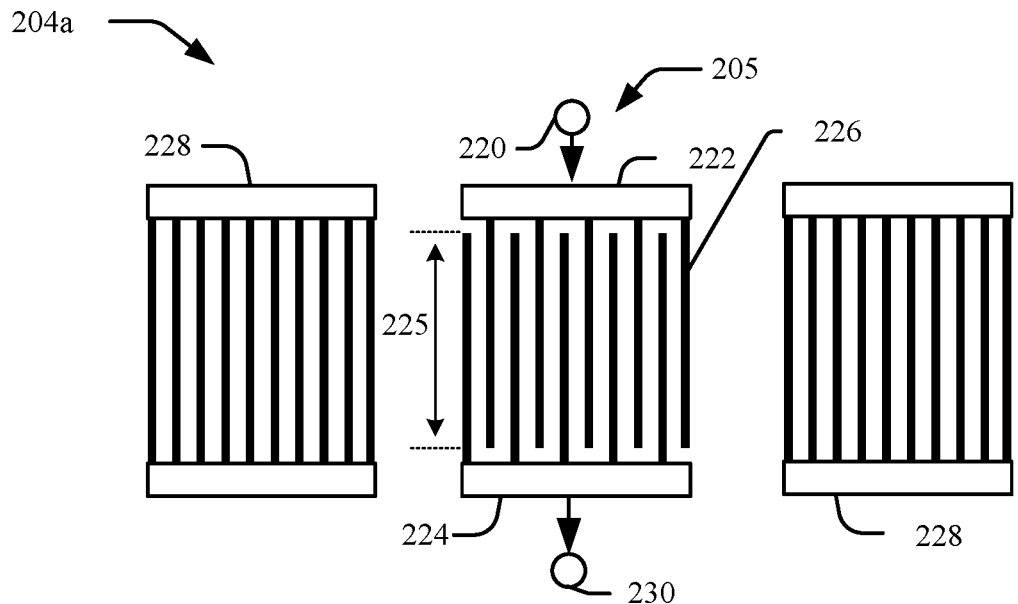
FIG. 2A is a top view of an example electrode structure of an electroacoustic device, in accordance with certain aspects of the present disclosure.

FIG. 2A is a top view of an example electrode structure 204a of an electroacoustic device. The electrode structure 204a has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222. Similarly, small gaps may also be formed between fingers 226 and any structure extending from the first busbar 222 or the second busbar 224 (e.g., stub fingers).

Between the busbars, there is an overlap region including a central region where a portion of one finger overlaps with a portion of an adjacent finger as illustrated by the central region 225. This central region 225 including the overlap may be referred to as the aperture, track, or active region where electric fields are produced between the fingers 226 to cause an acoustic wave to propagate in this region of the piezoelectric material 102. The periodicity of the fingers 226 is referred to as the pitch of the IDT. The pitch may be indicated in various ways. For example, in certain aspects, the pitch may correspond to a magnitude of a distance between fingers in the central region 225. This distance may be defined, for example, as the distance between center points of each of the fingers (and may be generally measured between a right (or a left) edge of one finger and the right (or left) edge of an adjacent finger when the fingers have uniform width). In certain aspects, an average of distances between adjacent fingers may be used for the pitch. The frequency at which the piezoelectric material vibrates is a main resonance frequency of the electrode structure 204a. This frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output, such as to one of the first terminal 220 or the second terminal 230, while the other terminal may function as an input.

A variety of electrode structures are possible. FIG. 2A may generally illustrate a one-port configuration. Other configurations (e.g., two-port configurations) are also possible. For example, the electrode structure 204a may have an input IDT 205 where each terminal 220 and 230 functions as an input. In this event, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

Figure 2B:
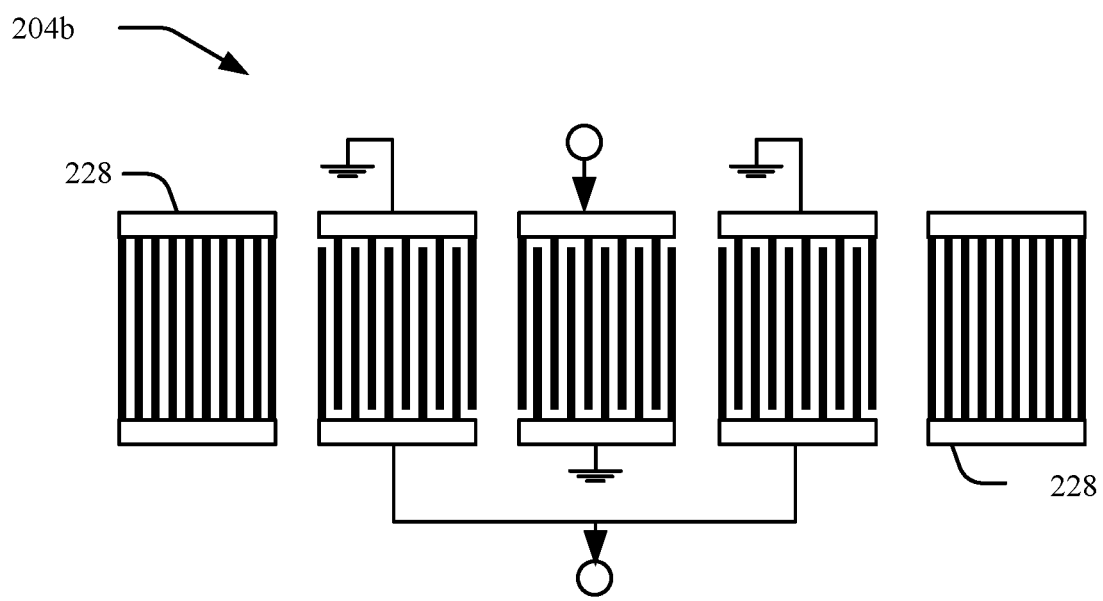
FIG. 2B is a top view of another example electrode structure of an electroacoustic device, in accordance with certain aspects of the present disclosure.

FIG. 2B is a top view of another example electrode structure 204b of an electroacoustic device. In this case, a dual-mode SAW (DMS) electrode structure 204b is illustrated, the DMS structure being a structure that may induce multiple resonances. The electrode structure 204b includes multiple IDTs arranged between reflectors 228 and connected as illustrated. The electrode structure 204b is provided to illustrate the variety of electrode structures that principles described herein may be applied to including the electrode structures 204a and 204b of FIGS. 2A and 2B.

It should be appreciated that while a certain number of fingers 226 are illustrated, the number of actual fingers and length(s) and width(s) of the fingers 226 and busbars may be different in an actual implementation. Such parameters depend on the particular application and desired filter characteristics. In addition, a SAW filter may include multiple interconnected electrode structures each including multiple IDTs to achieve a desired passband (e.g., multiple interconnected resonators or IDTs to form a desired filter transfer function).

Electroacoustic devices such as SAW resonators are being designed to cover more frequency ranges (e.g., 500 MHz to 6 GHz), to have higher bandwidths (e.g., up to 20%), and to have improved efficiency and performance. In general, SAW resonators are subject to nonlinearities that give rise to intermodulation distortion (IMD). For example, slight conductivity through the air or dielectric between the IDT electrodes can cause arcing and can worsen the nonlinearity, power durability, and compression of the device. Cascading the acoustic track can reduce certain amounts of intermodulation distortion, but this technique occupies increased space to implement and leads to larger SAW devices.

Notably, the relative permittivity ($\varepsilon_r$) of the piezoelectric substrate influences the intermodulation (nonlinearity) characteristic of a SAW filter. Nonlinear Mason equivalent circuit models have been used to simulate the effects that substrate permittivity can have on the nonlinearity of SAW filters. Furthermore, the relative permittivity of the material separating the electrodes that form IDTs on a SAW device likewise influences the nonlinearity behavior of the device. By adjusting the relative permittivity of certain dielectric structures in a SAW device, intermodulation distortion of the device can be reduced.

Figure 3:
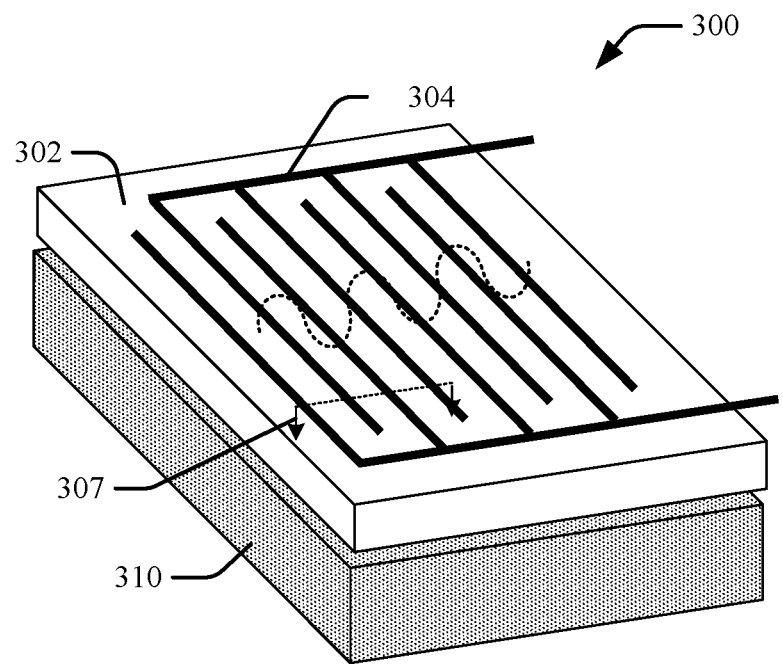
FIG. 3 is a diagram of a perspective view of an example electroacoustic device, in accordance with certain aspects of the present disclosure.

FIG. 3 is a diagram of a perspective view of another example of an electroacoustic device 300. The electroacoustic device 300 (e.g., that may be configured as or be a part of a SAW resonator) is similar to the electroacoustic device 100 of FIG. 1A but has a different layer stack. In particular, the electroacoustic device 300 includes a thin piezoelectric material 302 that is provided on a substrate 310 (e.g., silicon). The electroacoustic device 300 may be referred to as a thin-film SAW resonator in some cases. Based on the type of piezoelectric material 302 used (e.g., typically having higher coupling factors relative to the electroacoustic device 100 of FIG. 1) and a controlled thickness of the piezoelectric material 302, the particular acoustic wave modes excited may be slightly different than those in the electroacoustic device 100 of FIG. 1A. Based on the design (thicknesses of the layers, and selection of materials, etc.), the electroacoustic device 300 may have a higher quality factor (Q) as compared to the electroacoustic device 100 of FIG. 1A. In general, the substrate 310 may be substantially thicker than the piezoelectric material 302 (e.g., potentially on the order of 50 to 100 times thicker as one example, or more). The substrate 310 may include other layers (or other layers may be included between the substrate 310 and the piezoelectric material 302).

Figure 4:
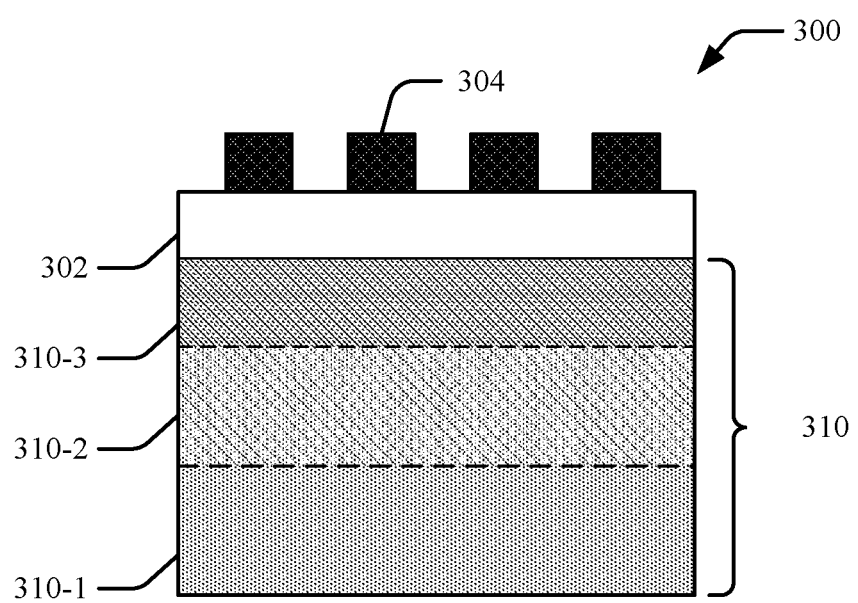
FIG. 4 is a diagram of a side view of an example electroacoustic device, in accordance with certain aspects of the present disclosure.

FIG. 4 is a diagram of a side view of the electroacoustic device 300 of FIG. 3 showing an exemplary layer stack (along a cross-section 307). In the example shown in FIG. 4, the substrate 310 may include sublayers such as a substrate sublayer 310-1 (e.g., of silicon) that may have a higher resistance (e.g., relative to the other layers—high resistivity layer). The substrate 310 may further include a trap rich layer 310-2 (e.g., poly-silicon). The substrate 310 may further include a compensation layer 310-3 (e.g., silicon dioxide ($SiO_2$) or another dielectric material) that may provide temperature compensation and other properties. These sublayers may be considered part of the substrate 310 or their own separate layers. A relatively thin piezoelectric material 302 is provided on the substrate 310 with a particular thickness for providing a particular acoustic wave mode (e.g., as compared to the electroacoustic device 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3 and 4). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the coupling to the electrode structure 304 and acoustic velocities within the piezoelectric material in different regions of the electrode structure 304 may differ between different types of electroacoustic devices, such as between the electroacoustic device 100 of FIG. 1A and the electroacoustic device 300 of FIGS. 3 and 4.

Example SAW Device with a Capacitor

As noted above, an electroacoustic device may be implemented using a network of multiple interconnected acoustic elements and other passive elements such as a capacitive element. The electroacoustic device may use on-die capacitive elements to meet certain specifications regarding the performance of a filter. For example, the capacitive elements may be used in the electroacoustic device for bandwidth adjustment (e.g., bandwidth widening), frequency response modeling or tailoring, or matching.

In some implementations, a capacitive element may be realized using an acoustic element. For example, an acoustic element (e.g., a SAW resonator) may be configured such that a phase associated with a response of the acoustic element is rotated by 90 degrees or a resonance frequency of the acoustic element is shifted out of a frequency of operation of the filter. In this manner, the acoustic element may operate as a capacitive element due to the electric isolation between the interdigital transducer (IDT) fingers of the acoustic element.

The use of the acoustic element for creating a capacitive element may have several drawbacks. For example, a significant portion of the signal power applied to the capacitive element may result in the excitation of acoustic waves on or into a piezoelectric substrate, resulting in power loss. In some aspects, a plate capacitor may be used to overcome such drawbacks. However, the plate capacitor may include silicon dioxide ($SiO_2$) as a dielectric region. The $SiO_2$ may have low permittivity, leading to a large area consumption by the plate capacitor. Also, the $SiO_2$ may be sputtered, which may result in defects and particles in the dielectric region.

A process flow to manufacture the plate capacitor may involve deposition of the dielectric region adjacent to an acoustic element (also referred to herein as an "acoustic device") with a subsequent etching of areas where the dielectric region may have been deposited. The etching process to remove areas of the dielectric region may be harmful to the acoustic element's integrity and functionality or other underlying structures associated with the filter. Certain aspects of the present disclosure are directed to techniques for protecting the acoustic element or other underlying structures associated with the filter to facilitate formation of a capacitive element on the same die as the acoustic element.

There are different types of etching processes that may be used during the fabrication of the filter. One type of etching process may alter the stoichiometry of a wafer surface used to implement the filter. Another type of etching process may alter the roughness of the wafer surface. Accordingly, depending on the type of etching process used, an area where the electroacoustic element is located may be protected prior to etching, as described in more detail herein.

In some implementations, a photoresist may be used to protect the wafer surface of the acoustic device. However, since the dielectric region's deposition may typically be performed at elevated temperatures, the photoresist tends to outgas during the dielectric region deposition process. Thus, the photoresist may be annealed at temperatures higher than the temperatures used for the dielectric region's deposition process. Due to cross-linking in the photoresist at these elevated temperatures, a photoresist removal process (e.g., using solvents such as dimethyl sulfoxide (DMSO) or N-methyl-2-pyrrolidone (NMP)) may not be effective. In some cases, a plasma-based process may be implemented to remove the photoresist. However, the plasma-based process may be ineffective and inefficient.

Example Etch Stop and Protection Layer for Capacitor Processing

Certain aspects of the present disclosure are directed to techniques for protecting an acoustic device by depositing a protective layer prior to deposition of a dielectric region for a capacitive element being formed in an acoustic device. The protective layer may operate as an etch stop and safety layer, which may prevent damage to a substrate, acoustic devices, and/or other underlying structures of the electroacoustic device during the dielectric region's selective removal (e.g., dry etching) process. In one example, the protective layer may be an aluminum oxide ($Al_2O_3$) layer. In another example, the protective layer may be an aluminum nitride (AlN) layer.

In certain aspects, the protective layer may be located either between an electrode and a dielectric region of the capacitive element or between a substrate and a bottom electrode of the capacitive element. The protective layer may be removed in some regions where the dielectric region has been etched. A wet chemical etch process may be implemented to remove the protective layer. For example, a tetramethylammonium hydroxide (TMAH) or an ammonia ($NH_3$) solution may be used to remove the protective layer. The wet chemical etch application to remove the protective layer may result in negligible effects on the integrity of a metal layer stack of the electroacoustic element or other underlying structures, as described herein.

Figure 5A:
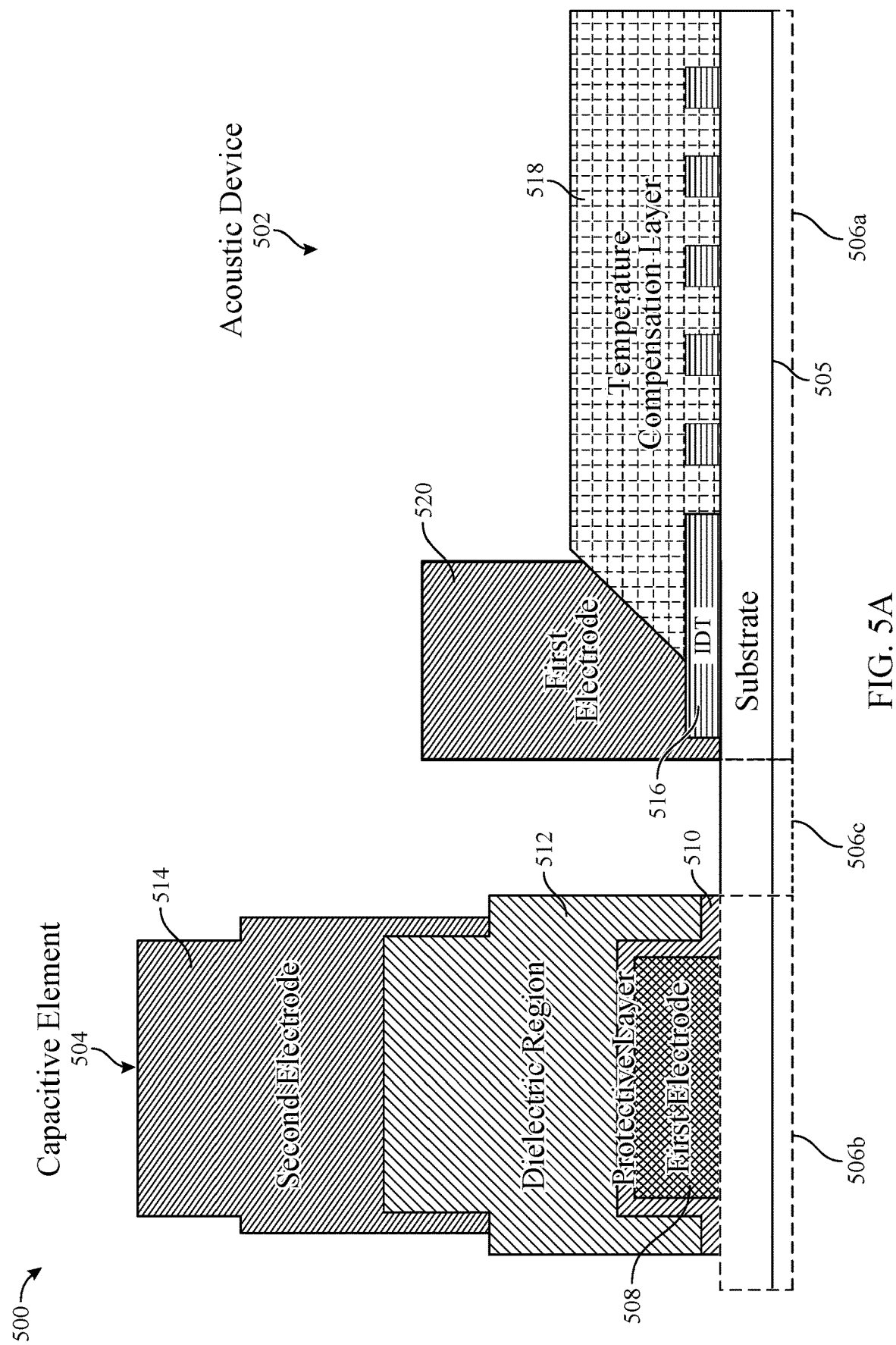
FIG. 5A illustrates an example electroacoustic device having a temperature compensation layer, in accordance with certain aspects of the present disclosure.

FIG. 5A illustrates an electroacoustic device 500, in accordance with certain aspects of the present disclosure. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced.

The electroacoustic device 500 includes an acoustic device 502 (e.g., a SAW element) and a capacitive element 504. The capacitive element 504 and the acoustic device 502 are formed above different regions of a substrate 505. For example, the acoustic device 502 may be formed above a first region 506a of the substrate 505, and the capacitive element 504 may be formed above a second region 506b of the substrate 505. The capacitive element 504 is positioned adjacent to the acoustic device 502, as illustrated. A third region 506c of the substrate 505 may be between the first region 506a and the second region 506b.

The capacitive element 504 includes a first electrode 508 (e.g., a bottom electrode of the capacitive element 504), a protective layer 510, a dielectric region 512, and a second electrode 514 (e.g., a top electrode of the capacitive element 504). The first electrode 508 may be above a portion of the second region 506b of the substrate 505. The protective layer 510 may be formed above the first electrode 508 and a portion of the substrate 505 and adjacent to lateral sides of the first electrode 508, as shown. The dielectric region 512 may be formed above the protective layer 510, and the second electrode 514 may be formed above at least a portion of the dielectric region 512, as shown.

The acoustic device 502 includes an interdigital transducer (IDT) 516, a temperature compensation layer 518, and a third electrode 520. The IDT 516 may be formed above a portion of the first region 506a of the substrate 505. The temperature compensation layer 518 may be formed above a portion of the IDT 516 and a portion of the first region 506a of the substrate 505. The third electrode 520 is electrically coupled to and formed above a busbar of the IDT 516. A portion of the third electrode 520 may be formed above the temperature compensation layer 518.

FIGS. 5B-5J illustrate techniques for fabricating an electroacoustic device, such as the electroacoustic device 500 of FIG. 5A, in accordance with certain aspects of the present disclosure.

As illustrated in FIG. 5B, one or more components of the acoustic device 502 may be formed. The one or more components of the acoustic device 502 include the IDT 516 and the temperature compensation layer 518, which are formed above the first region 506a of the substrate 505.

The one or more components of the acoustic device 502 may be formed in multiple processes. In a first process, the substrate 505 may be deposited. The substrate 505 may include a piezoelectric layer having a piezoelectric material. The piezoelectric material may include lithium niobate ($LiNbO_3$) such as a $LiNbO_3$ single crystal or lithium tantalate ($LiTaO_3$) such as a $LiTaO_3$ single crystal, gallium arsenide (GaAs), etc. In some cases, the piezoelectric material may include gallium nitride (GaN), zinc-sulfide (ZnS), cadmium-sulfide (CdS), quartz, or any combination thereof.

The IDT 516 may be formed above a portion of the first region 506a of the substrate 505. In one aspect, the IDT 516 may abut the portion of the first region 506a of the substrate 505. In another aspect, one or more other layers (e.g., an adhesion layer) may be disposed between the IDT 516 and the portion of the first region 506a of the substrate 505. In general, while some layers or regions are shown as being adjoining regions or layers, one or more layers (e.g., an adhesion layer) may be implemented between those regions or layers in some implementations.

In a second process, the temperature compensation layer 518 may then be formed above portions of the first region 506a of the substrate 505 and the IDT 516. In one aspect, the temperature compensation layer 518 may include silicon oxide.

FIG. 5C illustrates the formation of an insulating layer 522 above the substrate 505, the IDT 516, and the temperature compensation layer 518. For example, the insulating layer 522 may be $Al_2O_3$. In some aspects, the insulating layer 522 may be approximately 0.7 nm thick (e.g., an approximately 0.7 nm thick $Al_2O_3$ layer). The insulating layer 522 may be used to improve the reproducibility of photoresist footing.

Figure 5D:
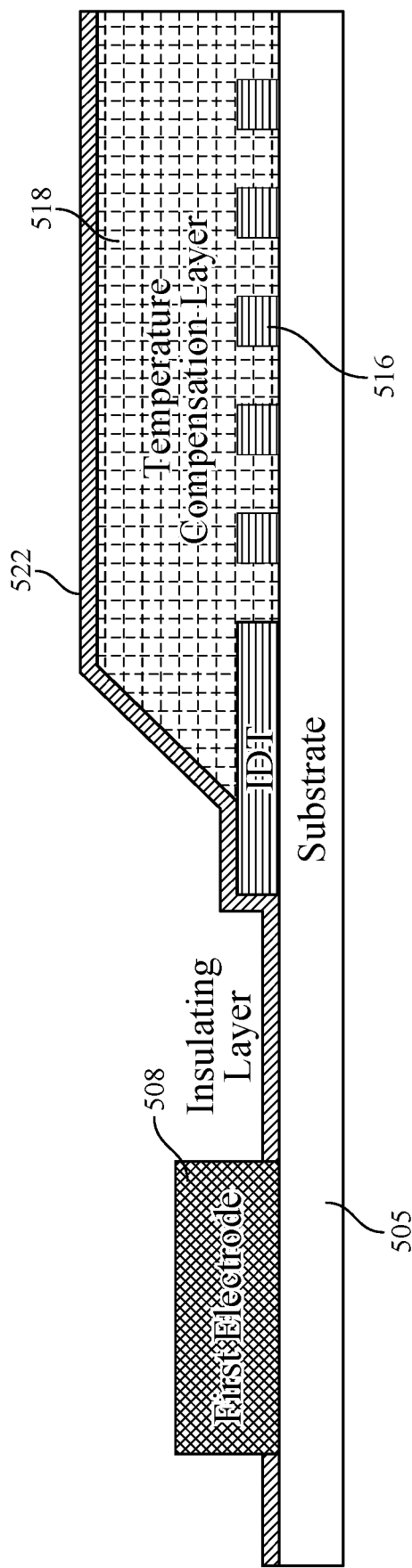

FIG. 5D illustrates the formation of the first electrode 508. To form the first electrode 508, a portion of the insulating layer 522 may be removed to form an opening. The first electrode 508 may be then formed in the opening. The first electrode 508 may be formed adjacent to the acoustic device 502. The first electrode 508 may include Cr and/or Cu, for example.

Figure 5E:
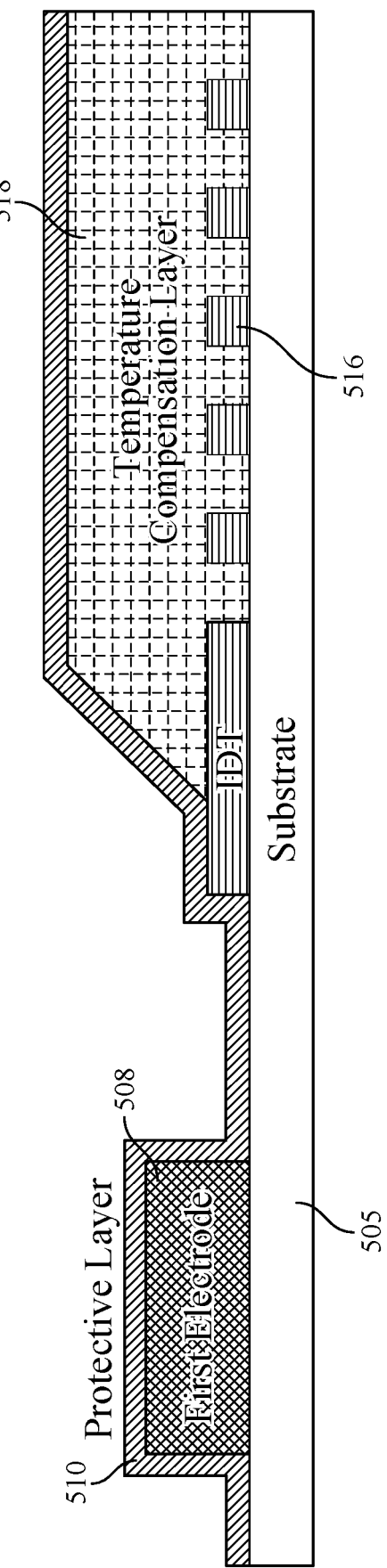

FIG. 5E illustrates the formation of the protective layer 510 above the first electrode 508 and the insulating layer 522. The protective layer 510 may be formed using an atomic layer deposition (ALD) process or other suitable process. In some aspects, the protective layer 510 may be composed of $Al_2O_3$, while in other aspects, the protective layer 510 may be an MN layer. The thickness of the protective layer 510 may be 15 nm, in some implementations.

Figure 5F:
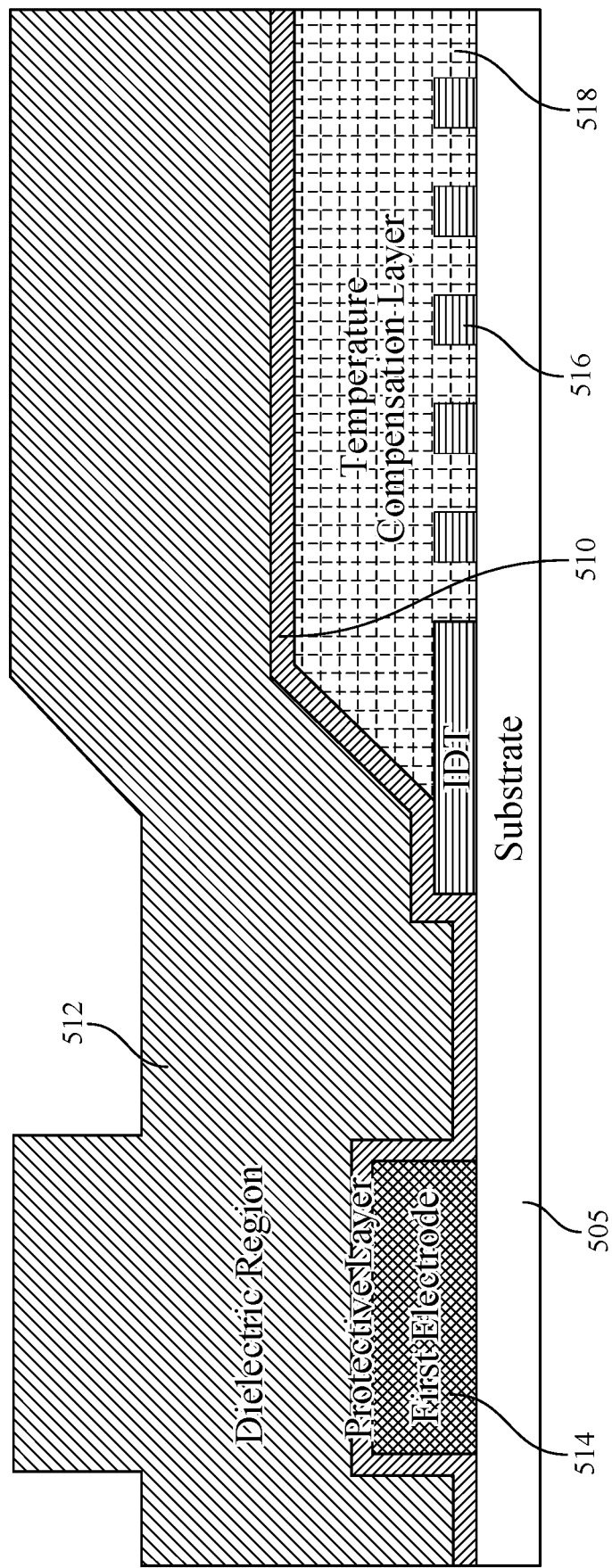

FIG. 5F illustrates the formation of the dielectric region 512 above the protective layer 510. As illustrated, the dielectric region 512 may be formed above both the first region 506a, the second region 506b, and the third region 506c. The dielectric region 512 includes a different material than the protective layer 510. For example, the dielectric region 512 includes $SiO_2$. In some implementations, the dielectric region 512 may be approximately 385 nm thick (e.g., an approximately 385 nm thick silicon nitride ($Si_xN_y$) layer).

Figure 5G:
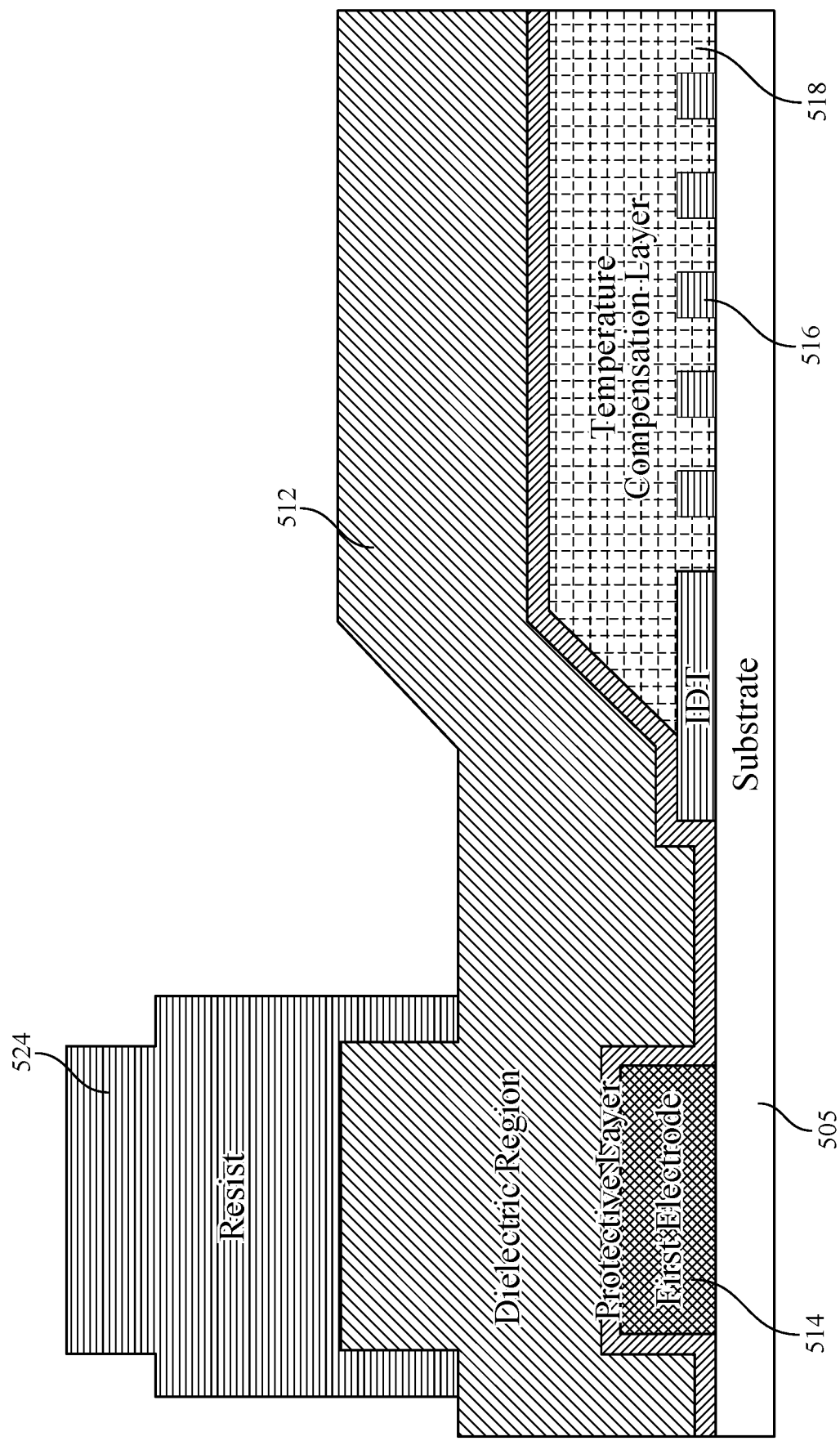
Figure 5H:
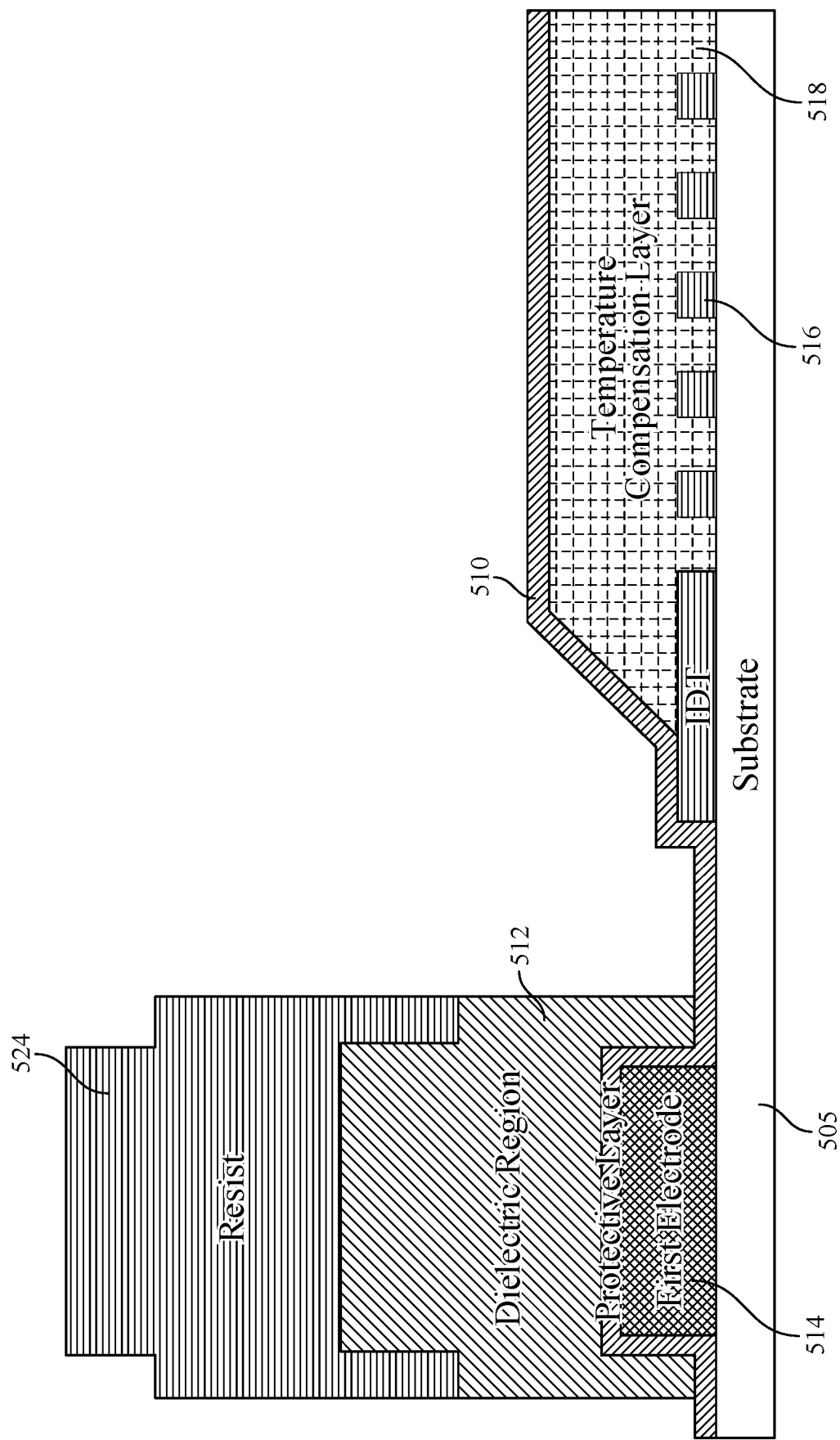
Figure 5I:
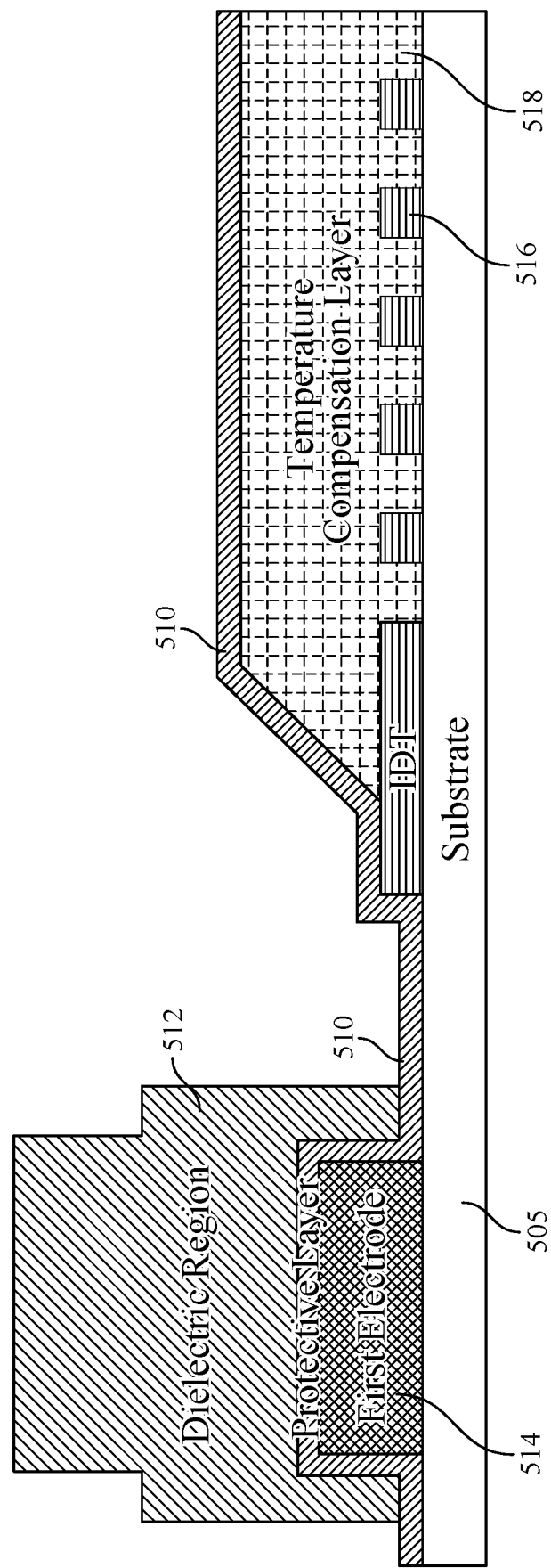

FIG. 5G illustrates an etching process, which is executed to remove a portion of the dielectric region 512. In one aspect, dry etch resist material 524 may be deposited above a portion of the dielectric region 512. As illustrated in FIG. 5H, a dry etch process or other suitable process may be used to remove the portions of the dielectric region 512 that are outside a shadow of the dry etch resist material 524. During the etching of the dielectric region 512, the protective layer 510 in effect operates as an etch stop layer by protecting and preventing dry etching of materials beneath the protective layer 510. As illustrated in FIG. 5I, the dry etch resist material 524 may be removed after the etching of the dielectric region 512.

Figure 5J:
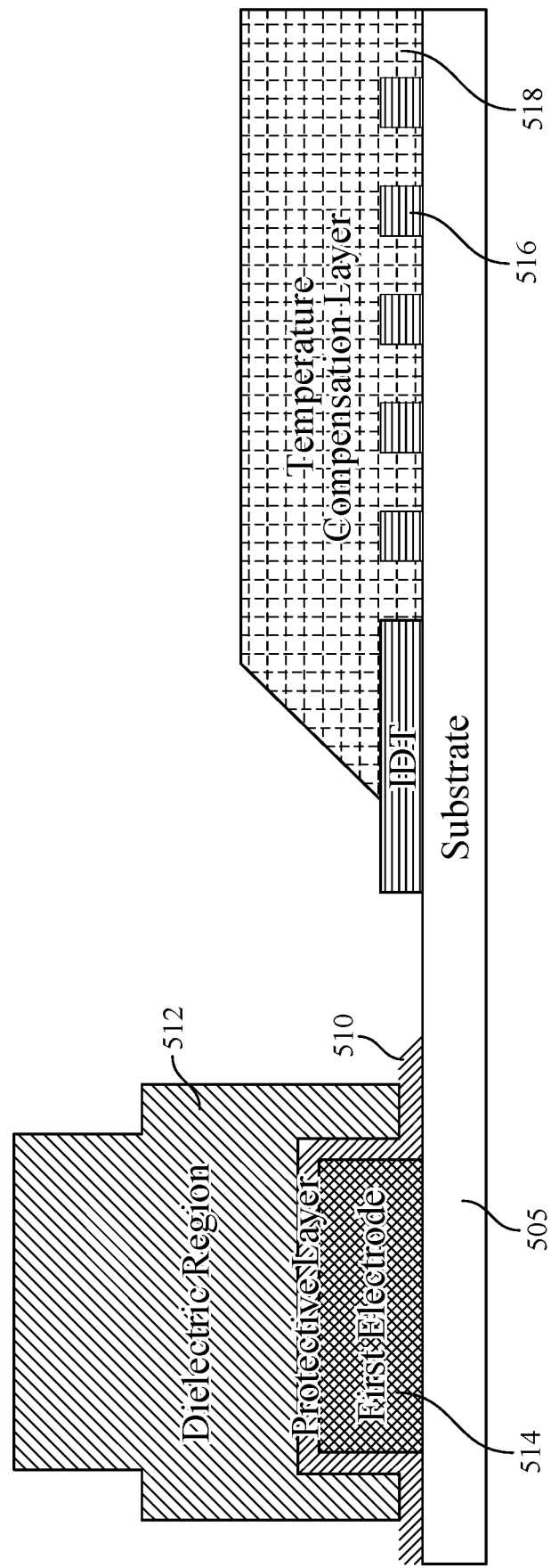

Once the dry etching of the dielectric region 512 is complete, a wet chemical etch process or another suitable process may be used to remove a portion of the protective layer 510 that is not covered by the dielectric region 512, as illustrated in FIG. 5J. The wet chemical etch process may use a TMAH or $NH_3$ solution to remove the portion of the protective layer 510.

As shown in FIG. 5A, the second electrode 514 may be then formed above the dielectric region 512, and the third electrode 520 may be formed above the busbar of the IDT 516. The second electrode 514 and the third electrode 520 may include an approximately 2.5 μm thick titanium (Ti), Cu, and/or Al layer, for example.

Figure 6A:
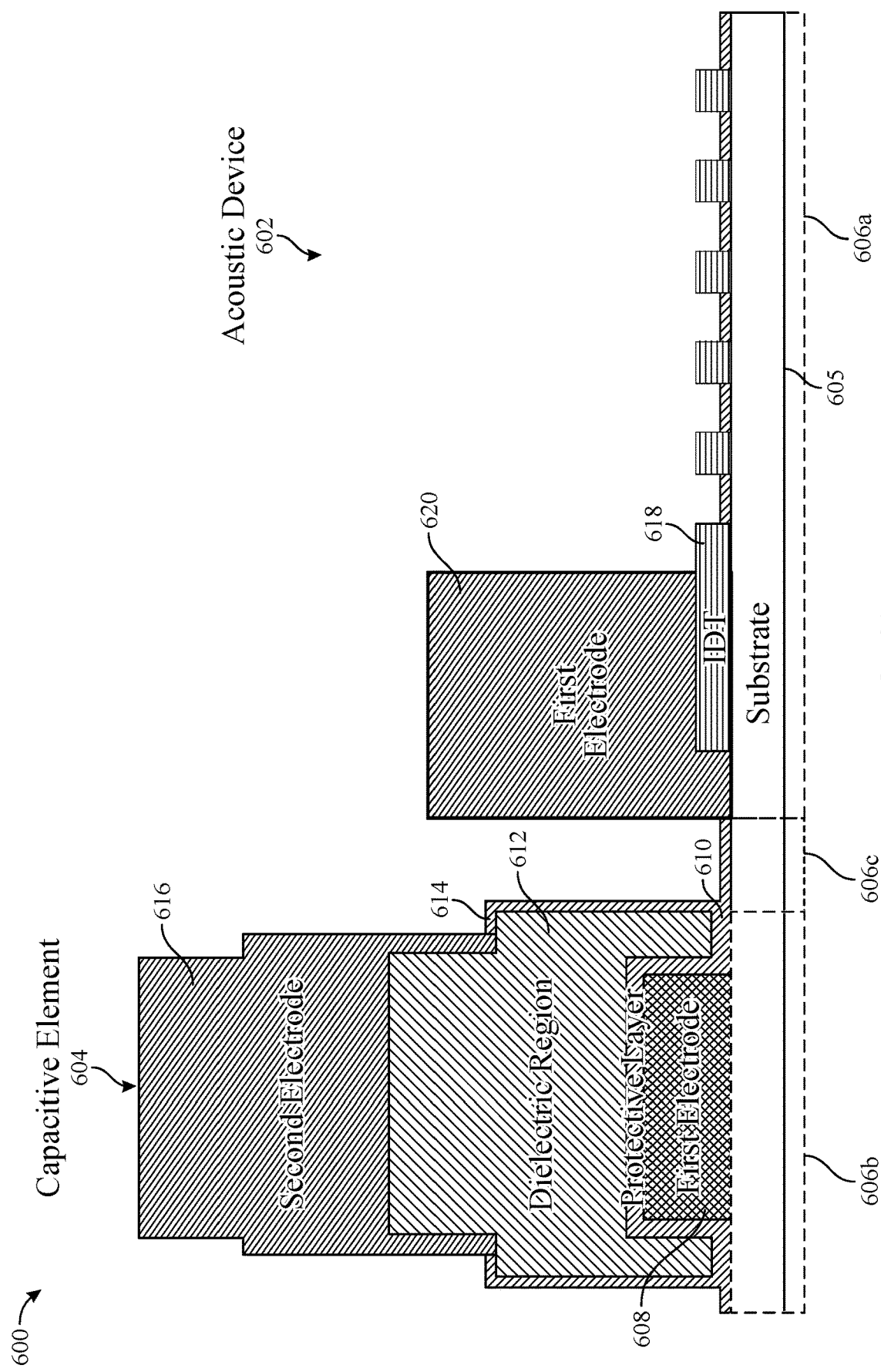
FIG. 6A illustrates an example electroacoustic device having a surface acoustic wave (SAW) element, in accordance with certain aspects of the present disclosure.

FIG. 6A illustrates an electroacoustic device 600, in accordance with certain aspects of the present disclosure. The electroacoustic device 600 includes an acoustic device 602 (e.g., a SAW element) and a capacitive element 604. In some aspects, the capacitive element 604 and the acoustic device 602 may be formed above different regions of a substrate 605. The acoustic device 602 may be formed above a first region 606a of the substrate 605, and the capacitive element 604 may be formed above a second region 606b of the substrate 605, as illustrated. As shown, the capacitive element 604 may be positioned adjacent to the acoustic device 602. A third region 606c of the substrate 605 may be between the first region 606a and the second region 606b.

As illustrated, the capacitive element 604 includes a first electrode 608 (e.g., a bottom electrode of the capacitive element 604), a protective layer 610, a dielectric region 612, an insulating layer 614, and a second electrode 616 (e.g., a top electrode of the capacitive element 604). The first electrode 608 may be above the second region 606b of the substrate 605. Moreover, the protective layer 610 may be above the first electrode 608 and a portion of the second region 606b of the substrate 605. The dielectric region 612 may be above the protective layer 610. The insulating layer 614 may be formed above the dielectric region 612, a portion of the second region 606b of the substrate 605, the third region 606c of the substrate 605, and the first region 606a of the substrate 605. In some aspects, a portion of the insulating layer 614 may be removed to form an opening in which the second electrode 616 may be formed, as illustrated.

In some aspects, the acoustic device 602 may include an IDT 618 and a third electrode 620. One or more openings may be formed in the insulating layer 614 for form openings in which the IDT 618 may be formed, as described in more detail herein. The third electrode 620 may be electrically coupled to and formed above a busbar of the IDT 618. A portion of third electrode 620 may be formed above the portion of the first region 606a of the substrate 605, as shown.

FIGS. 6B-6L illustrate techniques for fabricating an electroacoustic device, such as the electroacoustic device 600 of FIG. 6A, in accordance with certain aspects of the present disclosure.

Figure 6B:

As illustrated in FIG. 6B, the substrate 605 may be formed or provided. The substrate 605 may include a piezoelectric layer having a piezoelectric material. In some implementations, the piezoelectric material may include $LiNbO_3$ such as a $LiNbO_3$ single crystal or $LiTaO_3$ such as a $LiTaO_3$ single crystal, GaAs, etc. In some cases, the piezoelectric material may include GaN, ZnS, CdS, quartz, or any combination thereof.

Figure 6C:
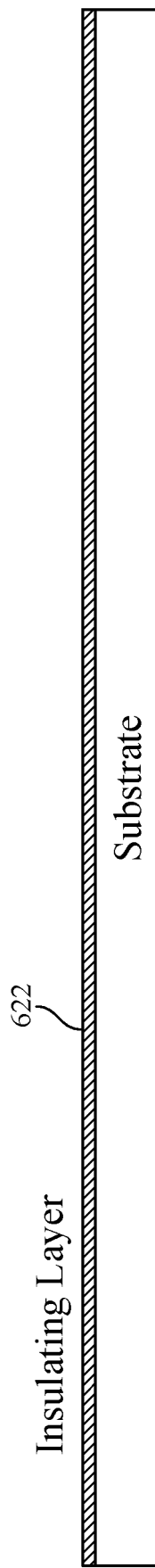

FIG. 6C illustrates the formation of an insulating layer 622 above the substrate 605. The insulating layer 622 may be $Al_2O_3$, for example. The insulating layer 622 may be approximately 0.7 nm thick (e.g., an approximately 0.7 nm thick $Al_2O_3$ layer).

Figure 6D:
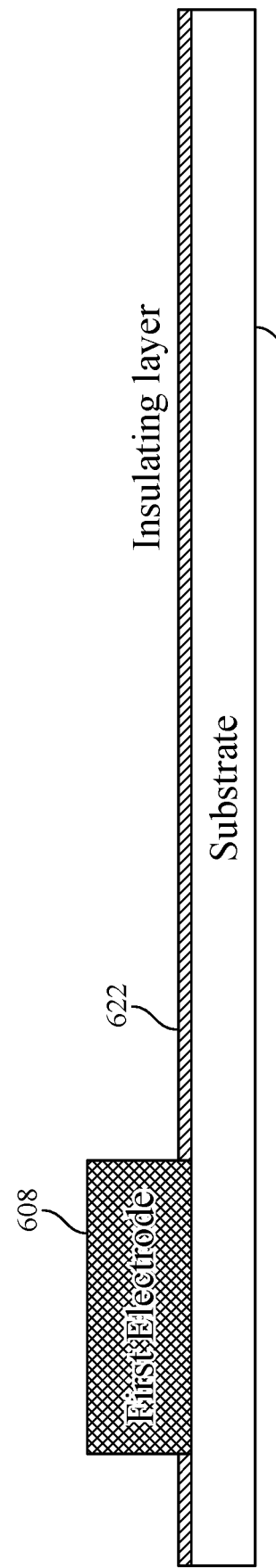

FIG. 6D illustrates the formation of the first electrode 608. To form the first electrode 608, a portion of the insulating layer 622 may be removed to form an opening. The first electrode 608 may be formed in the opening. The first electrode 608 may include Cr—Cu—Cr, for example.

Figure 6E:
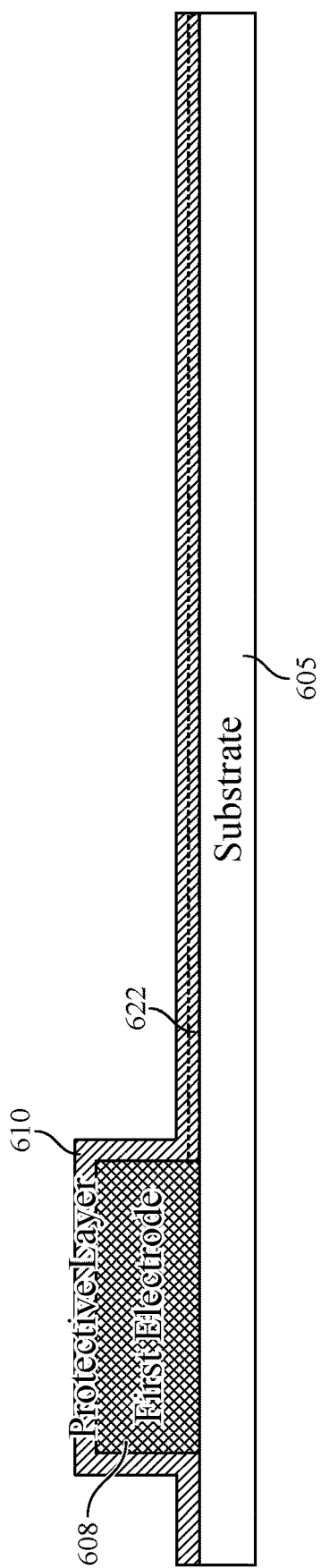

FIG. 6E illustrates the formation of the protective layer 610 above the first electrode 608 and the insulating layer 622. The protective layer 610 may be formed using an ALD process or other suitable process. In some aspects, the protective layer 610 may comprise $Al_2O_3$. In some aspects, the protective layer 610 may be an AlN layer. The thickness of the protective layer 610 may be 15 nm, in some implementations.

Figure 6F:
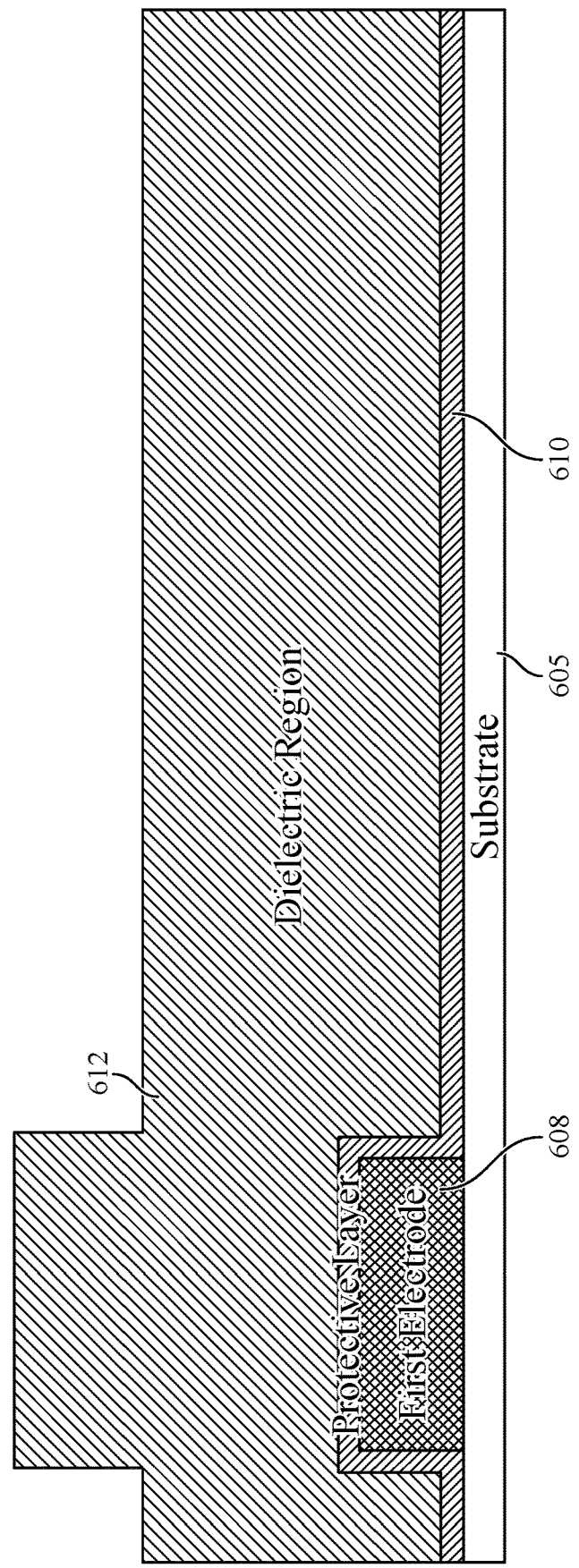

FIG. 6F illustrates the formation of the dielectric region 612. The dielectric region 612 may be formed above the protective layer 610. The dielectric region 612 may include a different material than the protective layer 610. For example, the dielectric region 612 may include $SiO_2$ or $Si_xN_y$. In some implementations, the dielectric region 512 may be approximately 385 nm thick (e.g., an approximately 385 nm thick $Si_xN_y$ layer).

Figure 6G:
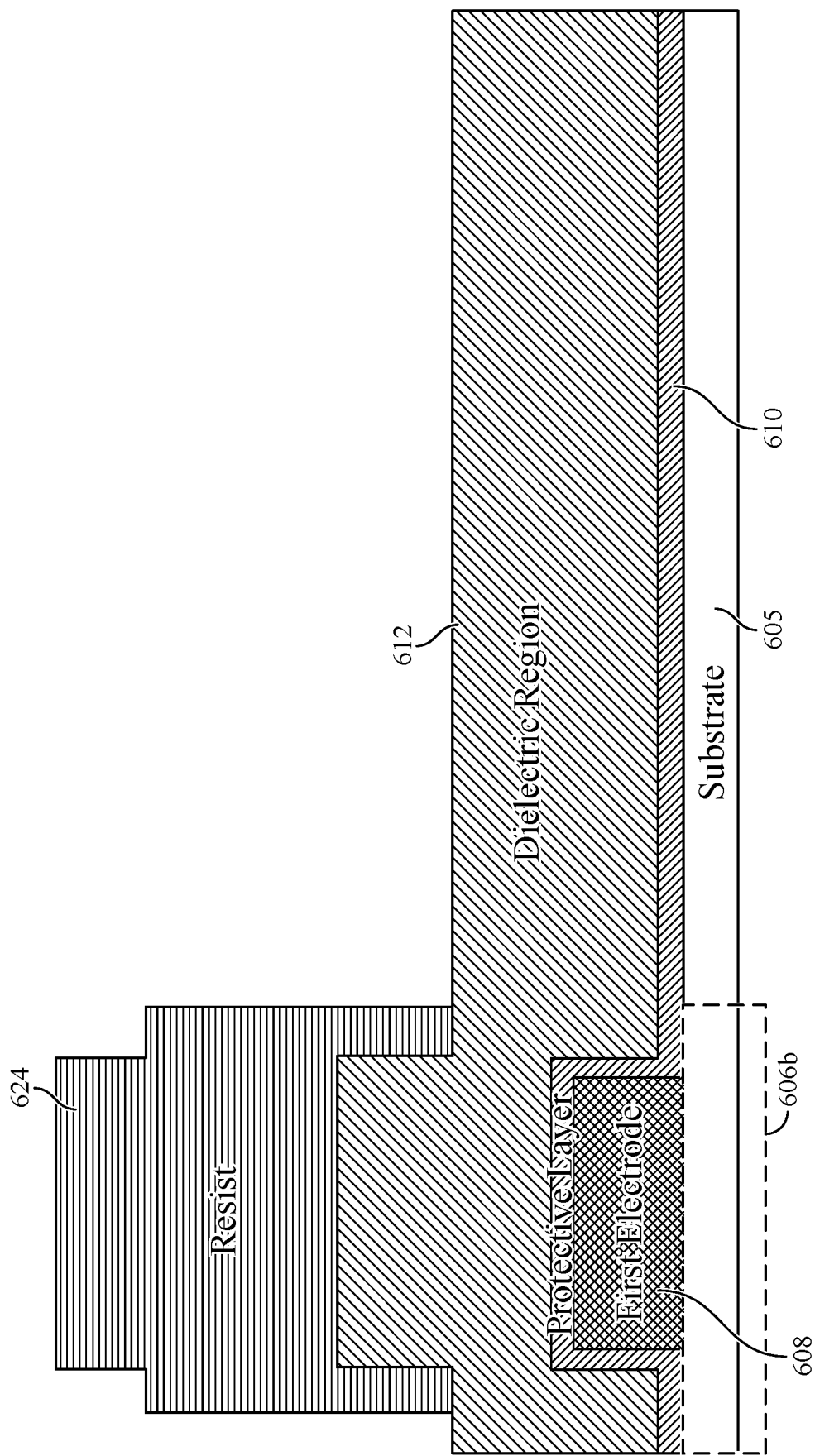
Figure 6H:
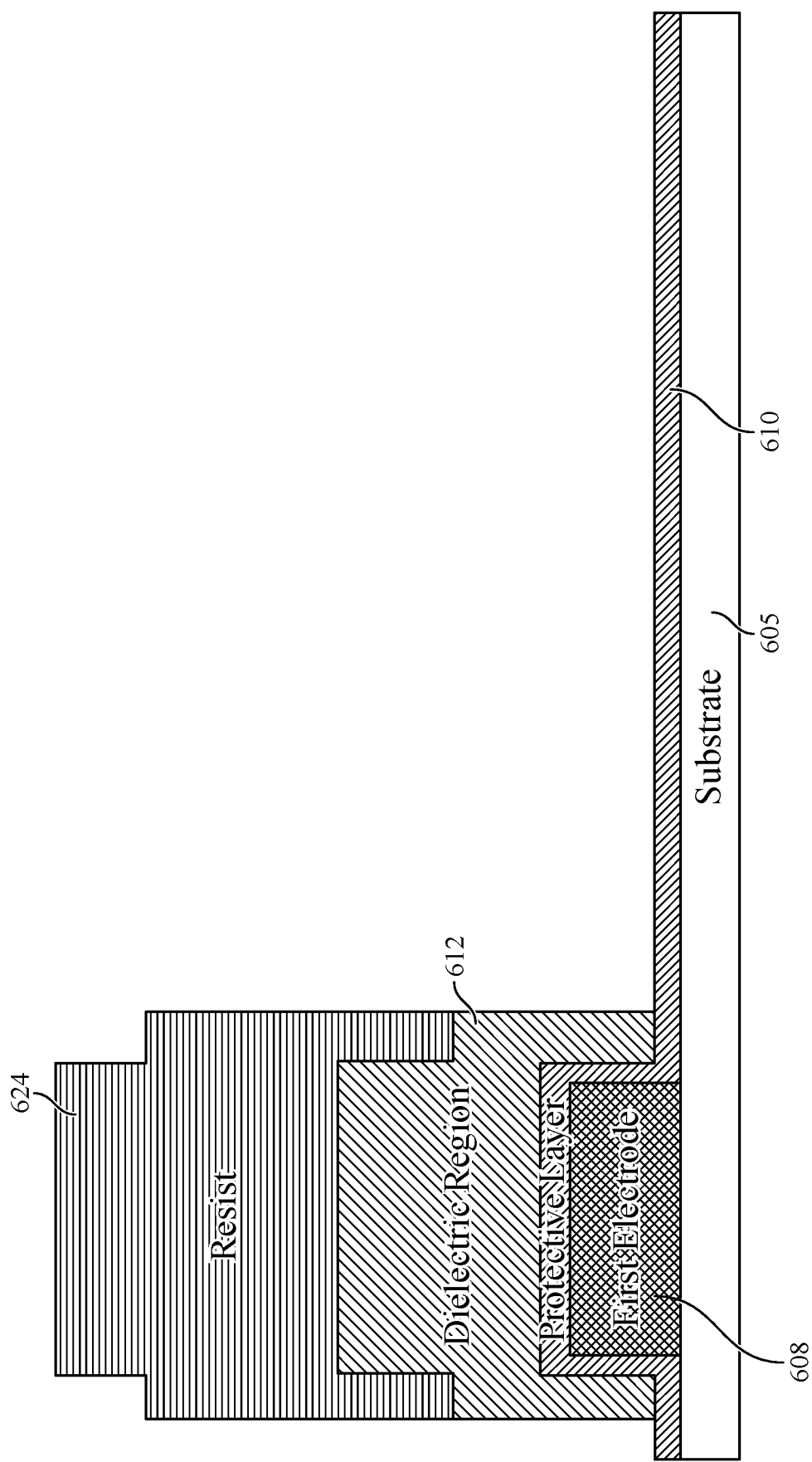
Figure 6I:
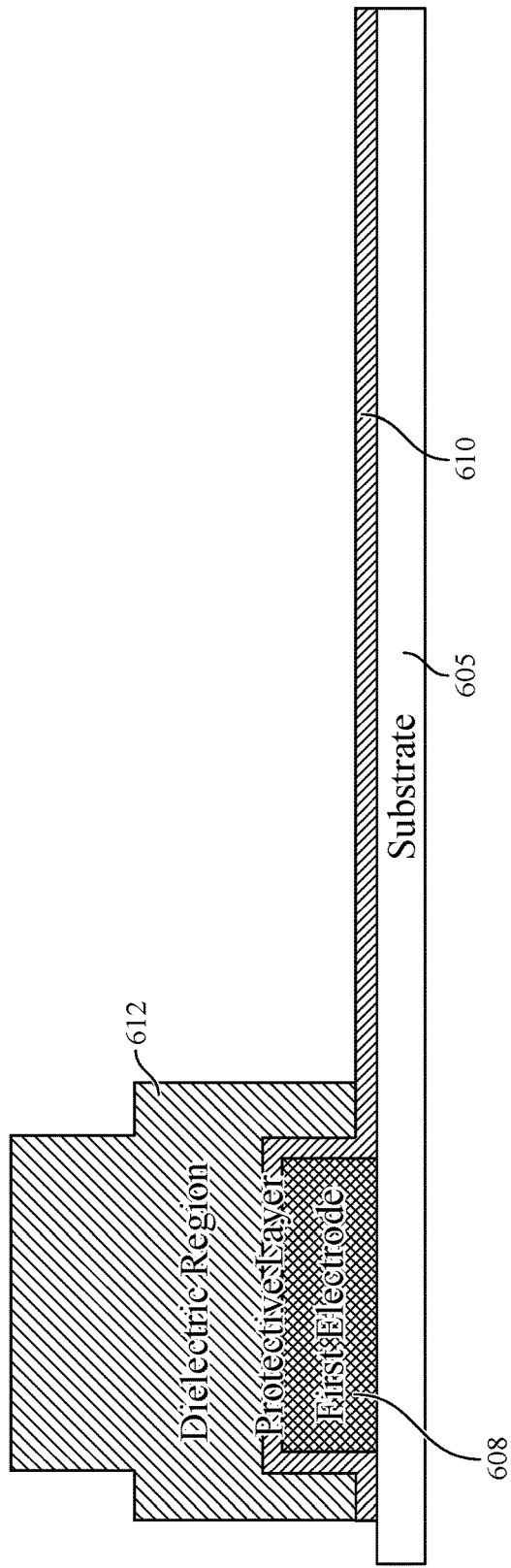

FIG. 6G illustrates an etching process, which is executed to remove a portion of the dielectric region 612. For example, dry etch resist material 624 may be deposited above a portion of the dielectric region 612 (e.g., above second region 606b), as shown. As illustrated in FIG. 6H, a dry etch process or other suitable process may be used to remove the portions of the dielectric region 612 that are outside a shadow of the dry etch resist material 624. As illustrated in FIG. 6I, the dry etch resist material 624 may be removed after the etching of the dielectric region 612. During the etching of the dielectric region 612, the protective layer 610 in effect operates as an etch stop layer by protecting and preventing dry etching of materials beneath the protective layer 610.

Figure 6J:
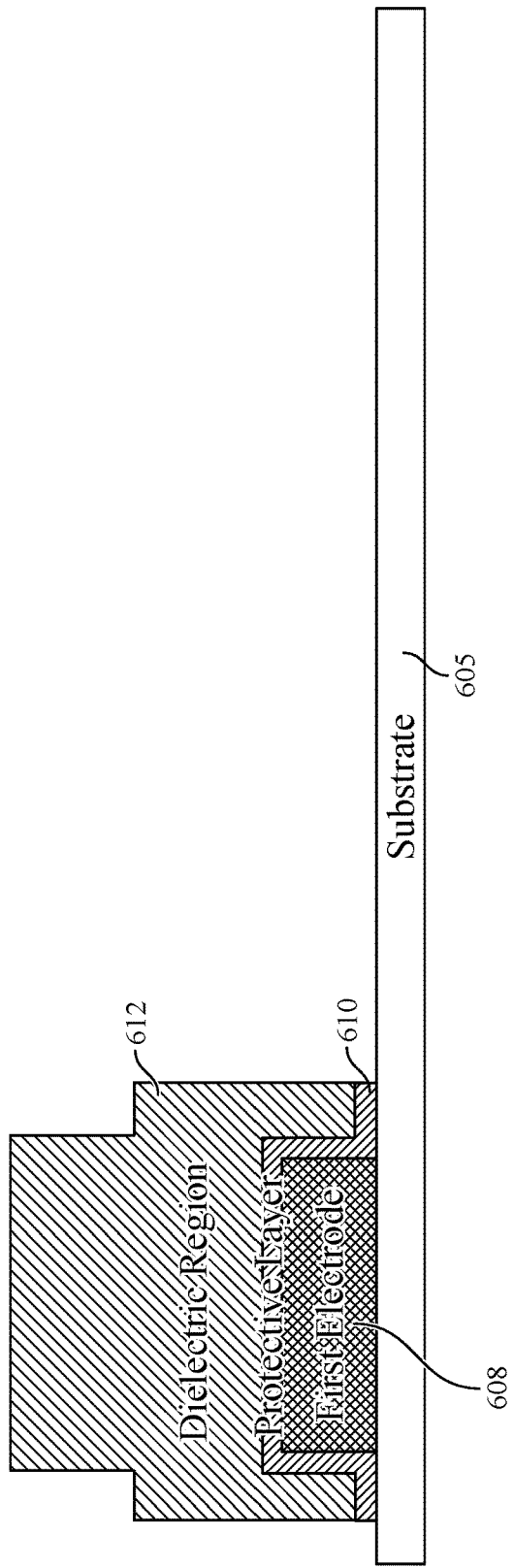

Once the dry etching of the dielectric region 612 is complete, a wet chemical etch process may be used to remove a portion of the protective layer 610 that is not covered by the dielectric region 612, as illustrated in FIG. 6J. The wet chemical etch process may use TMAH or $NH_3$ solution to remove the portion of the protective layer 610.

FIG. 6K illustrates the formation of the insulating layer 614 above the dielectric region 612 and the substrate 605. For example, the insulating layer 614 may be formed above the dielectric region 612, the first region 606a, and the third region 606c of the substrate 605. The insulating layer 614 may be composed of $Al_2O_3$, for example. The thickness of the insulating layer 614 may be 0.7 nm, in some implementations.

FIG. 6L illustrates the formation of the IDT 618. To form the IDT 618, one or more portions of the insulating layer 614 may be etched to form openings in the insulating layer 614. The IDT 618 is then formed in these openings in the insulating layer 614. The IDT 618 may include Ti—Cu—Al, for example.

As shown in FIG. 6A, the second electrode 616 and the third electrode 620 may be formed. As described herein, to form the second electrode 616, a portion of the insulating layer 614 is etched to form an opening in the insulating layer 614. The second electrode 616 is then formed in this opening. The second electrode 616 may include approximately a 2.5 µm thick Ti, Cu, and/or Al layer in some aspects. The third electrode 620 may be formed above the busbar of the IDT 618.

Example Etch Stop Protection Layer for Bulk Acoustic Wave (BAW) On-Die Capacitive Element Applications An electroacoustic device may be implemented using a network of multiple interconnected bulk acoustic wave (BAW) resonators and other passive elements such as a capacitive element and/or an inductive element. In some implementations, the capacitive element may be realized as a plate capacitor. A top electrode of a BAW resonator may serve as a bottom electrode of the capacitive element. The bottom electrode may be covered by a dielectric region. An electric pad (ePAD) may serve as a top electrode of the capacitive element, as described in more detail herein. Other regions of the electroacoustic device may also be covered by the same dielectric region, which may be used for local frequency correction (e.g., acoustic trimming) and/or passivation.

Some process flows may limit the use of a dielectric material to one that is suitable for specific acoustic properties of the BAW resonator. Furthermore, since the same dielectric region may be used for the capacitive element as well as the acoustic element, a compromise may be made for the dielectric region thickness. For example, the dielectric region may be selected such that the thickness of the dielectric region provides sufficient breakdown characteristics for the capacitive element while also meeting the target characteristics of the acoustic device.

The flexibility to use different dielectric layers (e.g., for a capacitive element and an acoustic element) that are each tuned for their respective purposes allows for improvements in filter performance. When different dielectric regions are used, certain portions of each dielectric region may be removed. The etching process to remove the portions of the dielectric regions may be harmful to the integrity and functionality of the acoustic element or other underlying structures associated with the filter. Certain aspects of the present disclosure are directed to techniques for protecting the acoustic element or other underlying structures associated with the electroacoustic device to facilitate the formation of the capacitive element.

Figure 7A:
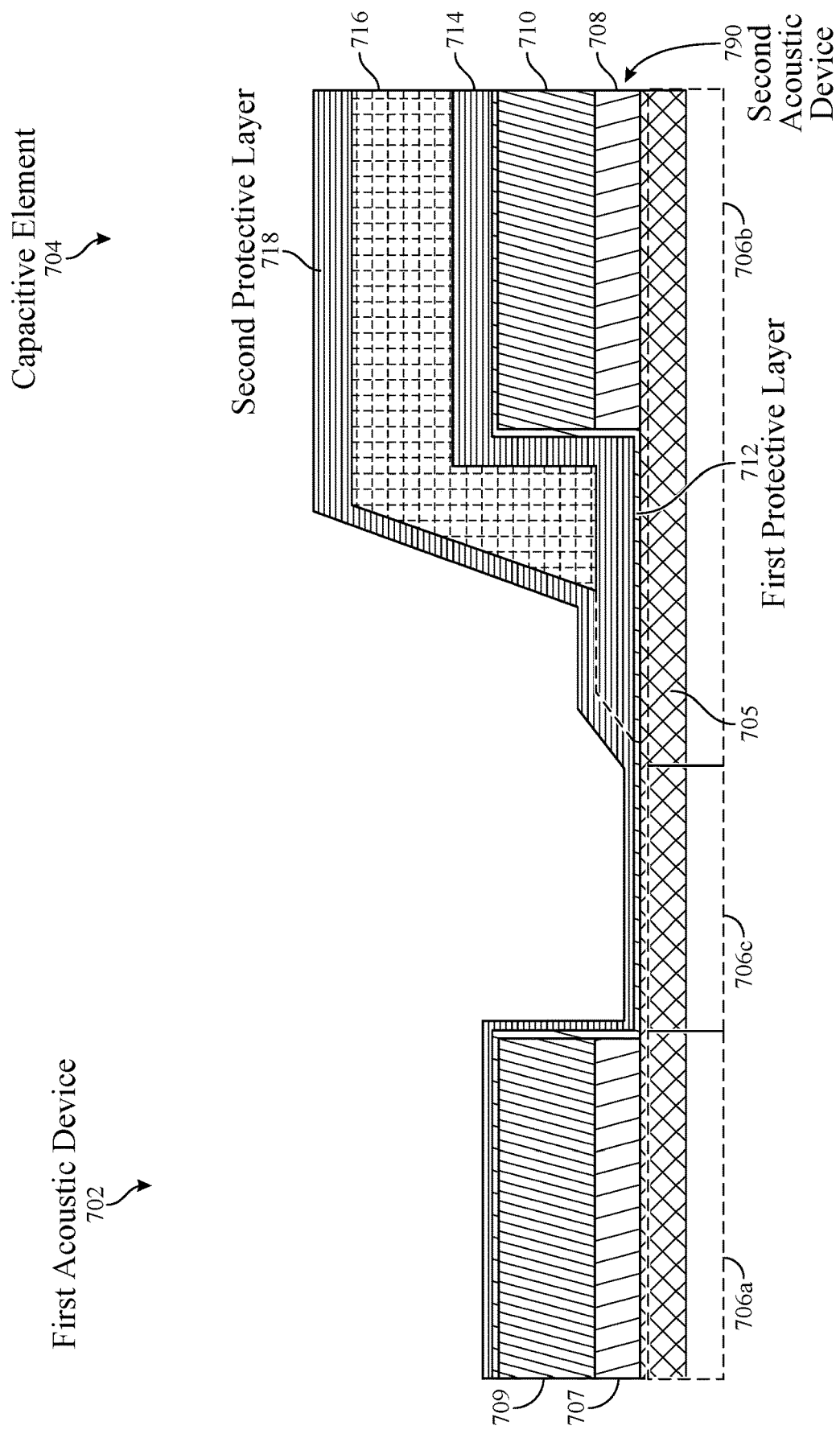
FIG. 7A illustrates an example electroacoustic device including a metal-insulator-metal capacitor (MIMCAP), in accordance with certain aspects of the present disclosure.

FIG. 7A illustrate an electroacoustic device 700, in accordance with certain aspects of the present disclosure. The electroacoustic device 700 may include an array of acoustic devices. For example, the electroacoustic device 700 may include a first acoustic device 702 and a second acoustic device 790. The electroacoustic device 700 includes the first acoustic device 702 (e.g., a BAW element) and a capacitive element 704, the capacitive element 704 being formed adjacent to and above the second acoustic device 790, as described in more detail herein. The capacitive element 704 and the first acoustic device 702 may be formed above different regions of a piezoelectric layer 705. The first acoustic device 702 may be formed above a first region 706a of the piezoelectric layer 705, and the capacitive element 704 may be formed above a second region 706b of the piezoelectric layer 705. The capacitive element 704 may be positioned adjacent to the first acoustic device 702, as shown. A third region 706c of the piezoelectric layer 705 may be between the first region 706a and the second region 706b.

The first acoustic device 702 includes one or multiple lateral features 707 (e.g., composed of silicon dioxide ($SiO_2$)) and an electrode 709. As used herein, a lateral feature generally refers to a local feature at an edge of a resonator (e.g., a mass load to reduce lateral energy leakage out of the resonator). The capacitive element 704 may be enhanced/formed by one or multiple layers, which may be used to form the one or multiple lateral features 707 of the first acoustic device 702, and thereby enhance the electrode thickness and or dielectric thickness.

As described herein, the electroacoustic device 700 includes the second acoustic device 790. The second acoustic device 790 may include a multitude of lateral features 708 (e.g., composed of $SiO_2$) and an electrode 710. The electrode 710 of the second acoustic device 790 may be configured as an electrode (e.g., bottom electrode) of the capacitive element 704.

As illustrated, the capacitive element 704 includes the electrode 710, a dielectric region 714, and an electrode 716 (e.g., an ePAD). A first protective layer 712 may be disposed above the electrode 709, the piezoelectric layer 705, and the electrode 710. The dielectric region 714 may be formed above the first protective layer 712. The electrode 716 may be formed above a portion of the dielectric region 714. A portion of the electrode 716 may be adjacent to a lateral side of the electrode 710, as shown. The second protective layer 718 may be formed above electrode 716, a portion of the dielectric region 714, and a portion of the first protective layer 712. The second protective layer 718 may provide corrosion protection for electrode 716.

FIGS. 7B-7H illustrate techniques for fabricating an electroacoustic device, such as the electroacoustic device 700 of FIG. 7A, in accordance with certain aspects of the present disclosure.

Figure 7B:
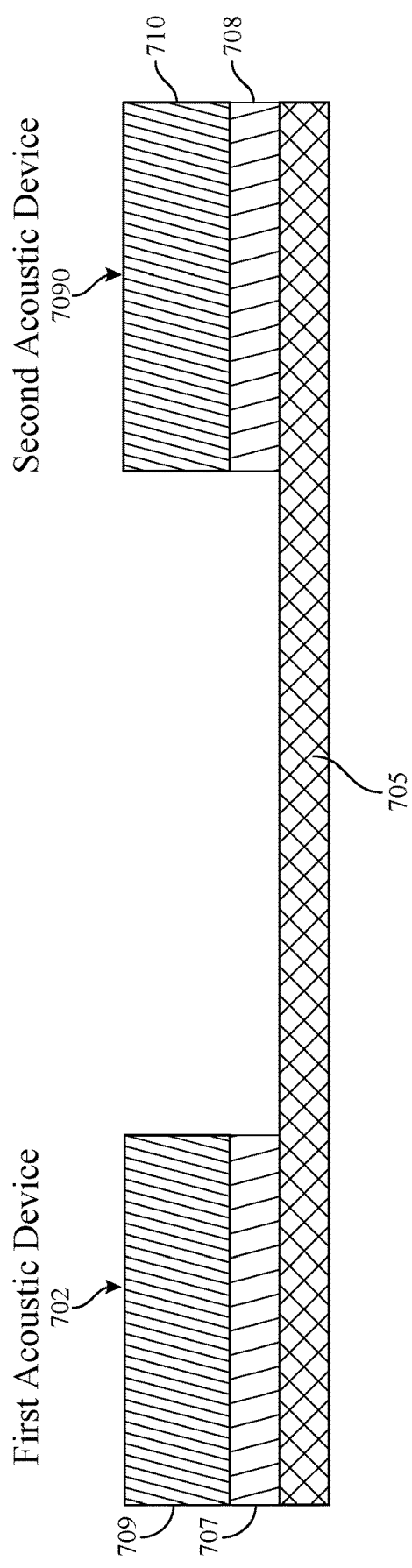
FIGS. 7B-7H illustrate a fabrication process for an example electroacoustic device, such as the electroacoustic device of FIG. 7A, in accordance with certain aspects of the present disclosure.

As illustrated in FIG. 7B, the acoustic devices 702, 790 are formed on the piezoelectric layer 705. The piezoelectric layer 705 may include AlN or AlN based layers enriched with dopants to enhance the piezoelectric effect, $LiNbO_3$ (such as a $LiNbO_3$ single crystal), $LiTaO_3$ (such as an $LiTaO_3$ single crystal), GaAs, etc. In some aspects, the piezoelectric material may include GaN, ZnS, CdS, quartz, or any combination thereof.

The first acoustic device 702 includes lateral feature 707 and electrode 709. The electrode 709 of the first acoustic device 702 may be formed above the lateral feature 707, as shown. The second acoustic device 790 includes a lateral feature 708 and electrode 710. The electrode 710 of the second acoustic device may be formed above the lateral feature 708 of the second acoustic device, as shown.

Figure 7C:
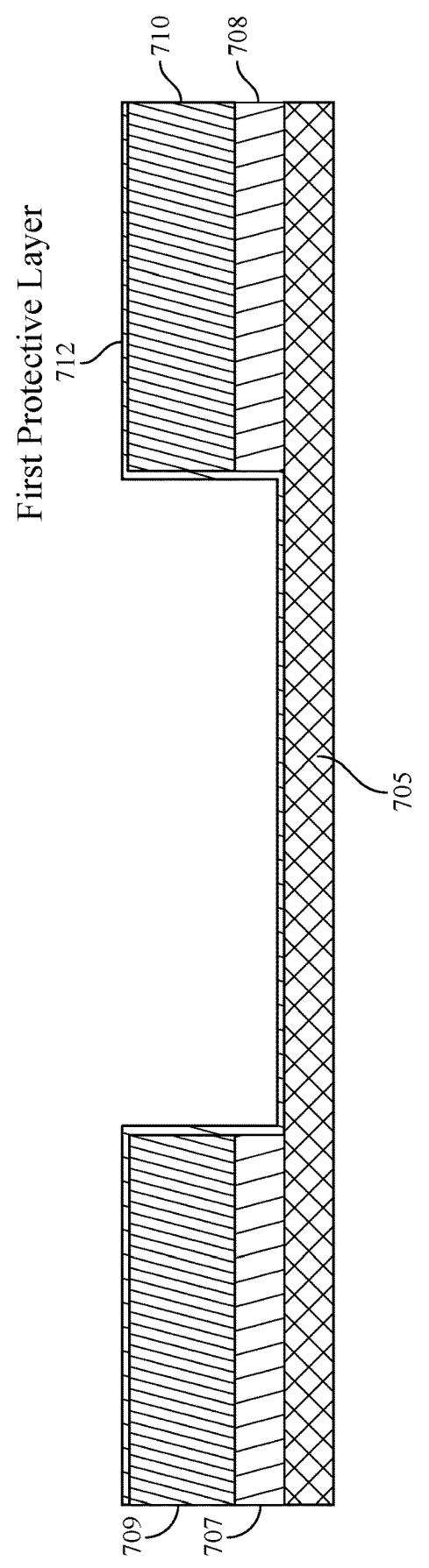

FIG. 7C illustrates the formation of the first protective layer 712 above the electrodes 709, 710 of the acoustic devices 702, 790 and the piezoelectric layer 705. The first protective layer 712 may be formed using an atomic layer deposition (ALD) process or another suitable process. The first protective layer 712 may comprise $Al_2O_3$, for example. In other aspects, the first protective layer 712 may be an AlN layer.

Figure 7D:
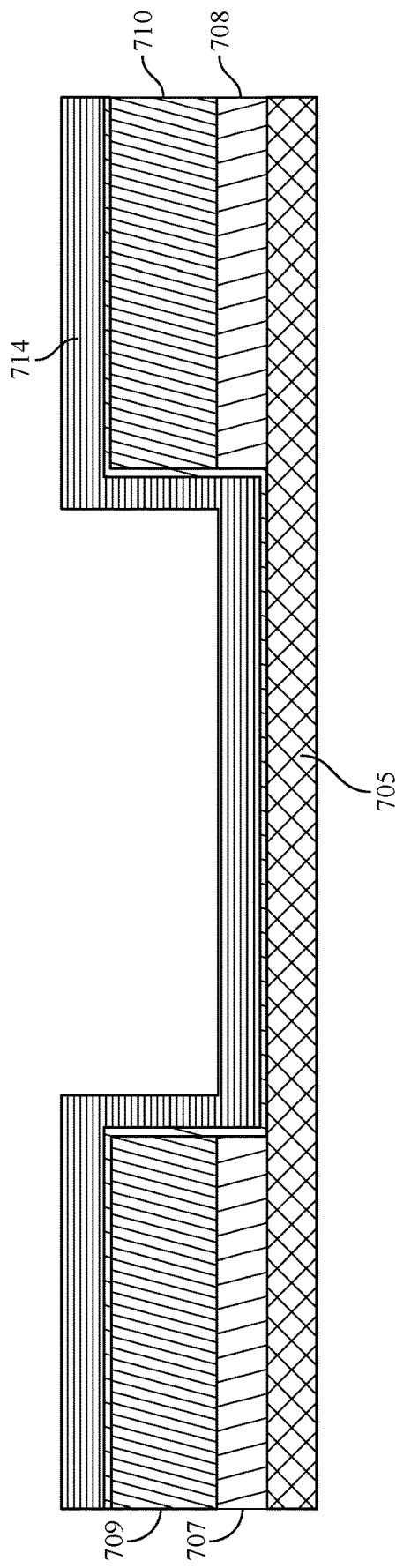

FIG. 7D illustrates the formation of the dielectric region 714. As illustrated, the dielectric region 714 may be formed above the first protective layer 712. The dielectric region 714 may include a different material than the first protective layer 712. For example, the dielectric region 714 may include $SiO_2$ or $Si_xN_y$.

Figure 7E:
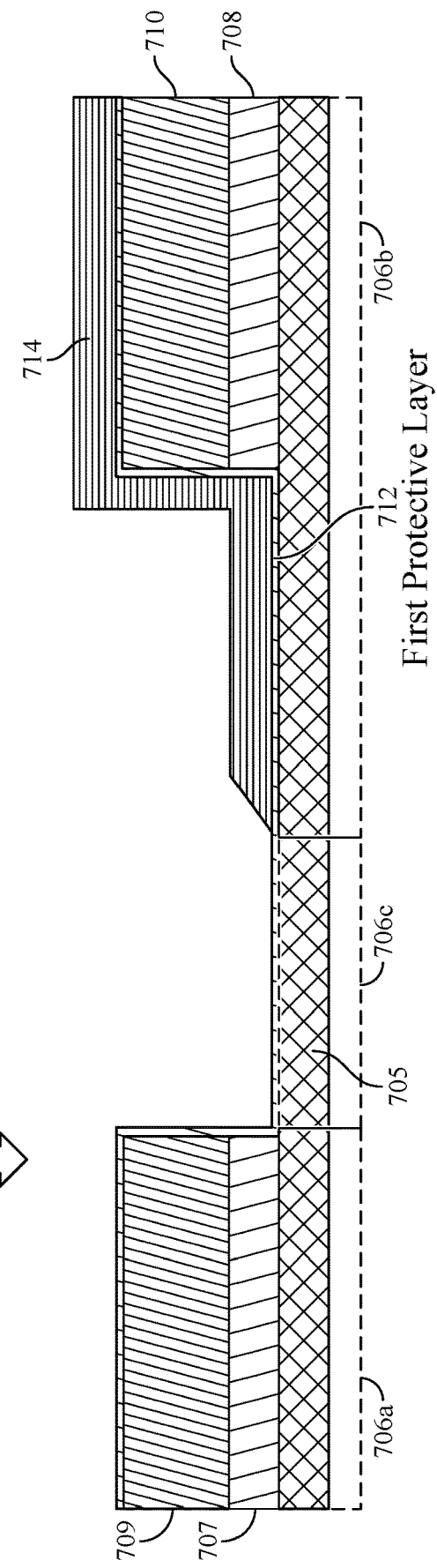

FIG. 7E illustrates an etching process, which is executed to remove a portion of the dielectric region 714. For example, a resist may be deposited above a portion of the dielectric region 714 (e.g., above the second region 706b). A portion of the dielectric region 714 that is not covered by the resist material may be removed using an etching process. During the etching process, the first protective layer 712 in effect operates as an etch stop layer by protecting and preventing dry etching of materials beneath the first protective layer 712.

Figure 7F:
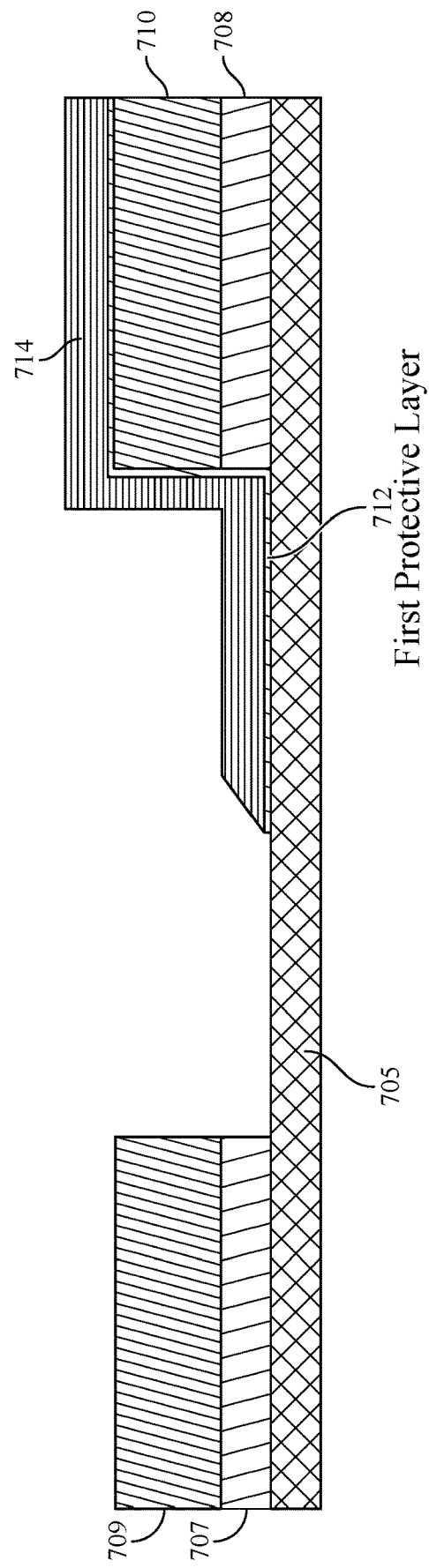

Once the dry etching of the dielectric region 714 is complete, a selective etching process (e.g., a wet etching process) may be used to optionally remove a portion of the first protective layer 712 that is not covered by the dielectric region 714, as illustrated in FIG. 7F. In some aspects, any wet chemical etch process may be used to remove the portion of the first protective layer 712. The wet chemical etch process may use TMAH or $NH_3$ solution in some implementations. In some implementations, the portion of the first protective layer 712 may not be removed, as shown in FIG. 7G.

Figure 7G:
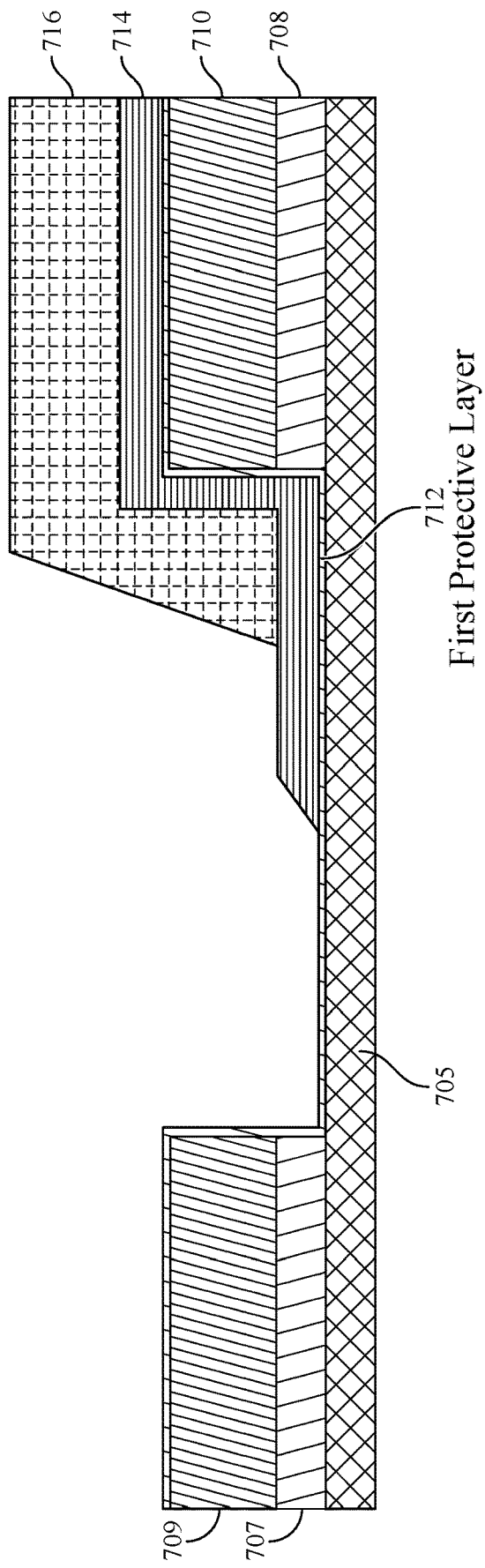

FIG. 7G illustrates the formation of the electrode 716. The electrode 716 may be formed above a portion of the dielectric region 714, as shown. A portion of the electrode 716 may be formed adjacent to the lateral side of the electrode 710.

Figure 7H:
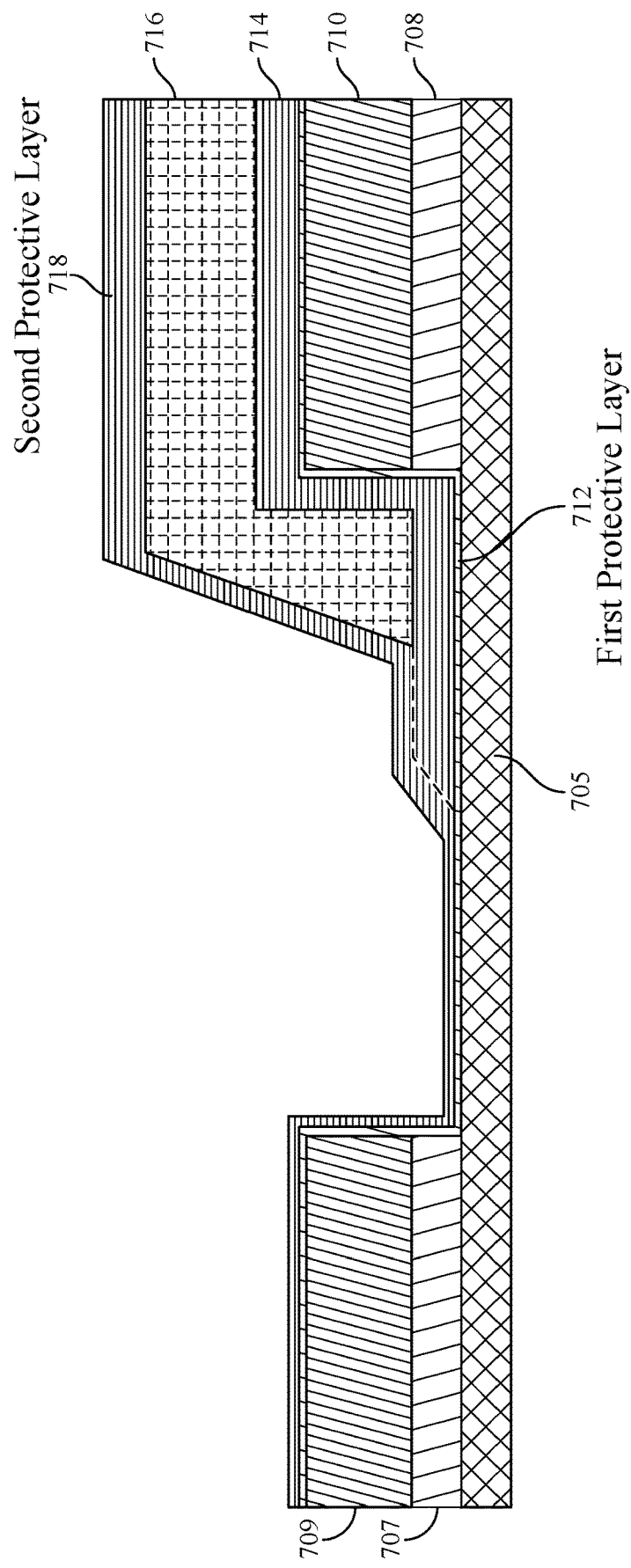

FIG. 7H illustrates the formation of the second protective layer 718. As shown, the second protective layer 718 may be formed above electrode 716, the dielectric region 714, and the first protective layer 712. In some aspects, the second protective layer 718 may be a dielectric layer The second protective layer 718 may be formed using a plasma enhanced chemical vapor deposition (PECVD) process. After forming the second protective layer 718, a portion of the second protective layer 718 may be trimmed to meet a target characteristic (e.g., frequency) for the first acoustic device 702, as shown in FIG. 7A.

Figure 8:
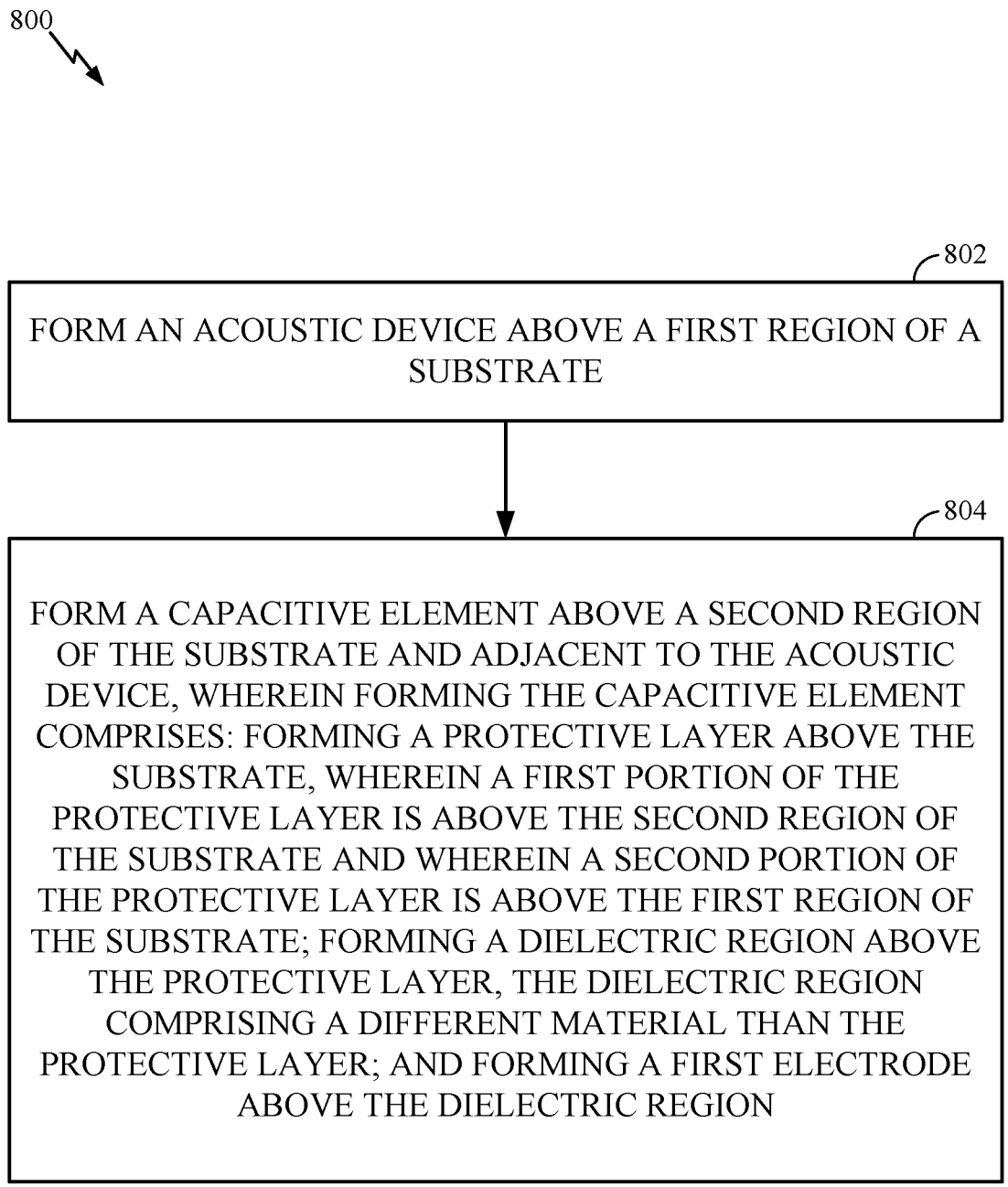
FIG. 8 is a flow diagram depicting example operations for forming an electroacoustic device, in accordance with certain aspects of the present disclosure.

FIG. 8 is a flow diagram depicting example operations 800 for fabricating an electroacoustic device, in accordance with certain aspects of the present disclosure. The operations 800 may be performed by a fabrication facility, for example.

The operations 800 may begin, at block 802, with the fabrication facility forming an acoustic device (e.g., acoustic device 502, 602, or 702 of FIGS. 5A, 6A, 7A) above a first region (e.g., first region 506a, 606a, or 706a of FIGS. 5A, 6A, 7A) of a substrate (e.g., substrate 505 or 605, or piezoelectric layer 705 of FIGS. 5A, 6A, 7A).

At block 804, a capacitive element (e.g., capacitive element 504, 604, or 704 of FIGS. 5A, 6A, 7A) is formed above a second region (e.g., second region 506b, 606b, or 706b of FIGS. 5A, 6A, 7A) of the substrate and adjacent to the acoustic device.

In some aspects, the forming of the capacitive element includes forming of a protective layer above the substrate. A first portion of the protective layer (e.g., protective layer 510, 610, or 712 of FIGS. 5A, 6A, 7A) may be formed above the second region of the substrate and a second portion of the protective layer may be formed above the first region of the substrate. The forming of the capacitive element may further include forming a dielectric region (e.g., dielectric region 512, 612, or 714 of FIGS. 5A, 6A, 7A) above the protective layer. The dielectric region may include a different material than the protective layer, in some aspects. The forming of the capacitive element may further include forming a first electrode (e.g., second electrode 514, 616, or 716 of FIGS. 5A, 6A, 7A) above the dielectric region.

In certain aspects, the first portion of the protective layer may be formed above a second electrode (e.g., first electrode 508, 608, or 710 of FIGS. 5A, 6A, 7A) of the capacitive element. In certain aspects, the fabrication facility may form an insulating layer (e.g., insulating layer 522 or 622 of FIG. 5A or 6A) and subsequently remove a portion of the insulating layer. The second electrode may be then formed in an opening from which the portion of the insulating layer was removed. In some aspects, the protective layer may be formed above the second electrode. In certain aspects, the insulating layer and the protective layer include a same material. A thickness of the protective layer may be greater than a thickness of the insulating layer, in some aspects.

In certain aspects, the forming the dielectric region includes forming the dielectric region above the first region and the second region of the substrate, and etching a portion of the dielectric region that is above the first region of the substrate. In certain aspects, the second portion of the protective layer is formed above the acoustic device. The second portion of the protective layer is removed above the acoustic device after the etching of the portion of the dielectric region that is above the first region of the substrate. In certain aspects, a third portion of the protective layer may be above a third region (e.g., third region 506c, 606c, or 706c of FIGS. 5A, 6A, 7A) of the substrate. The third region of the substrate may be between the first region and the second region of the substrate. In certain aspects, the third portion of the protective layer may be removed after the etching of the portion of the dielectric region that is above the third region of the substrate.

In certain aspects, the second electrode may be formed above the second region of the substrate. Moreover, the first portion of the protective layer may be formed above the second electrode of the capacitive element.

In certain aspects, the fabrication facility may remove the second portion of the protective layer that is above the first region of the substrate, and form an insulating layer (e.g., insulating layer 614 of FIG. 6A) above the dielectric region and the first region of the substrate after the removing the second portion of the protective layer. In certain aspects, the insulating layer may be formed prior to forming the acoustic device. In certain aspects, forming the acoustic device includes etching one or more portions of the insulating layer to form one or more openings in the insulating layer, and forming an IDT (e.g., IDT 516 or 618 of FIG. 5A or 6A) in the one or more openings.

In certain aspects, the semiconductor fabrication facility forms a third electrode (e.g., third electrode 520 or 620 of FIG. 5A or 6A) above a busbar of the IDT. In certain aspects, the fabrication facility may form another acoustic device (e.g., the second acoustic device 790 of FIG. 7A) having a top electrode above the second region of the substrate (e.g., a piezoelectric layer). The first portion of the protective layer may be formed above a second electrode of the capacitive element, the second electrode of the capacitive element being the top electrode of the other acoustic device. In certain aspects, the first portion of the protective layer may be formed above the other acoustic device. In certain aspects, a portion of the first electrode may be formed adjacent to a lateral side of the top electrode.

In certain aspects, the fabrication facility forms another protective layer (e.g., the second protective layer 718 of FIG. 7A) above the acoustic device and the first electrode, and trims a portion of the other protective layer that is above the acoustic device. The other protective layer may be formed using a PECVD process.

In certain aspects, the substrate may include a piezoelectric substrate formed of a piezoelectric material. The protective layer may include an $Al_2O_3$ layer or an MN layer. In certain aspects, the protective layer may be formed using an ALD process. In some aspects, the protective layer may include an etch stop layer configured to prevent dry etching beneath the etch stop layer.

Figure 9:
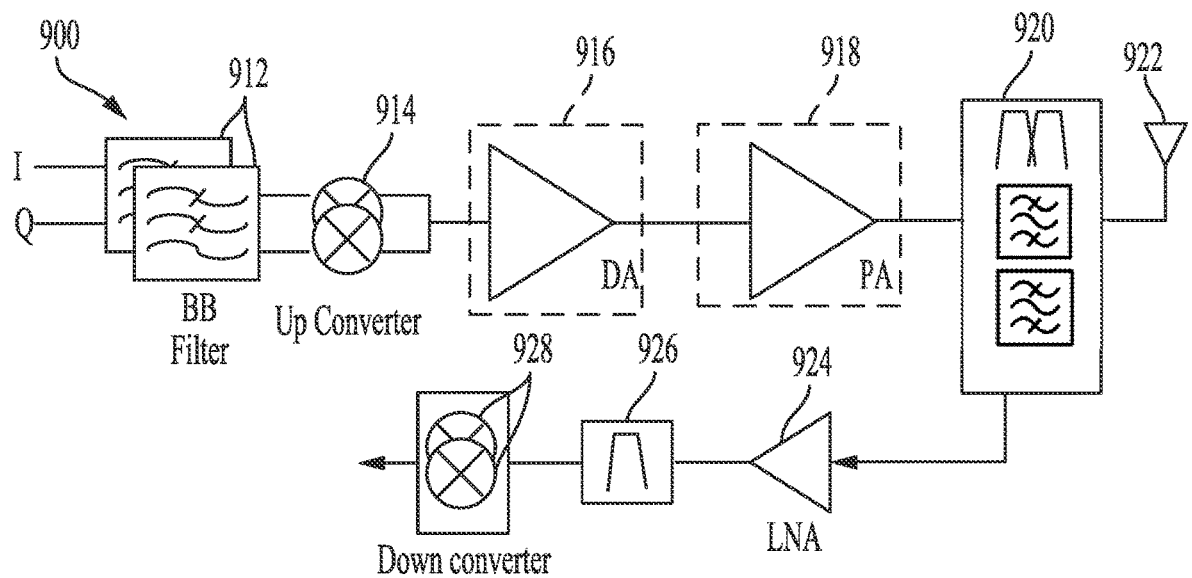
FIG. 9 is a functional block diagram of at least a portion of an example simplified wireless transceiver circuit in which an electroacoustic filter circuit may be employed, in accordance with certain aspects of the present disclosure.

FIG. 9 is a functional block diagram of at least a portion of an example of a simplified wireless transceiver circuit 900 in which the electroacoustic device 500, 600, or 700 of FIG. 5A, 6A, or 7A may be employed. The transceiver circuit 900 is configured to receive signals/information for transmission (shown as in-phase (I) and quadrature (Q) values) which is provided to one or more baseband (BB) filters 912. The filtered output is provided to one or more mixers 914 for upconversion to radio frequency (RF) signals. The output from the one or more mixers 914 may be provided to a driver amplifier (DA) 916 whose output may be provided to a power amplifier (PA) 918 to produce an amplified signal for transmission. The amplified signal is output to the antenna 922 through one or more filters 920 (e.g., duplexers if used as a frequency division duplex transceiver or other filters). The one or more filters 920 may include the electroacoustic device 500, 600, or 700 of FIG. 5A, 6A, or 7A.

The antenna 922 may be used for both wirelessly transmitting and receiving data. The transceiver circuit 900 includes a receive path through the one or more filters 920 for a received RF signal to be provided to a low noise amplifier (LNA) 924 and a further filter 926 and then downconverted from the receive frequency to a baseband frequency through one or more mixer circuits 928 before the signal is further processed (e.g., provided to an analog-to-digital converter (ADC) and then demodulated or otherwise processed in the digital domain). There may be separate filters for the receive circuit (e.g., may have a separate antenna or have separate receive filters) that may be implemented using the electroacoustic device 500, 600, or 700 of FIG. 5A, 6A, or 7A.

Figure 10:
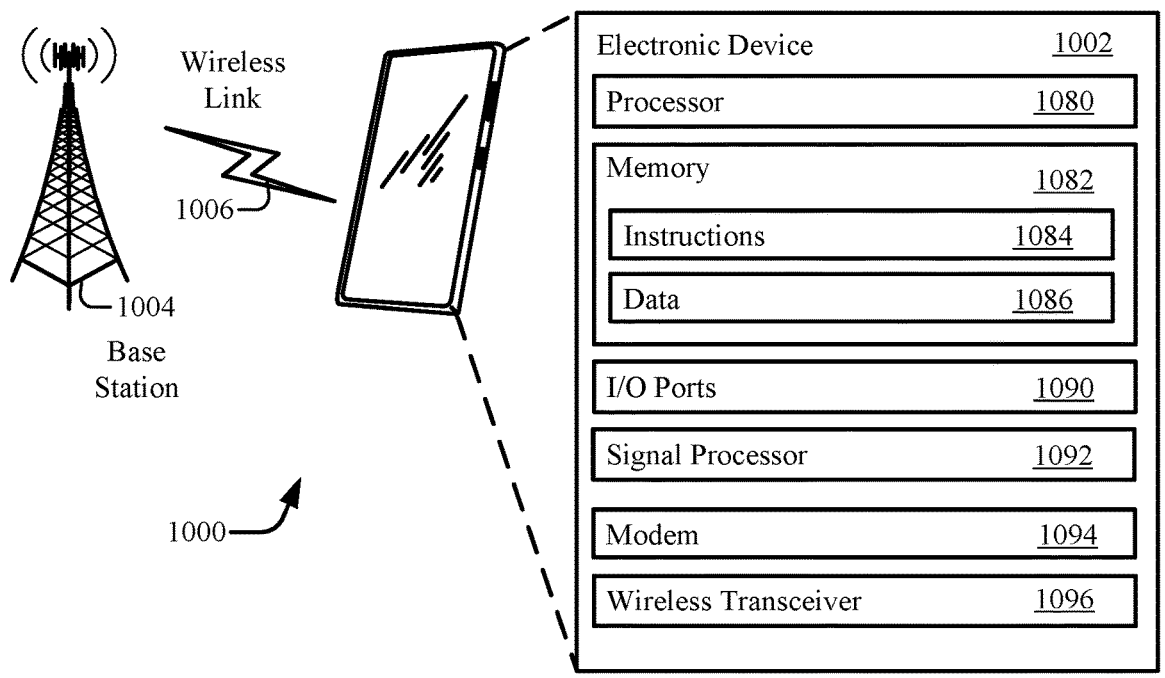
FIG. 10 is a diagram of an environment that includes an electronic device having a wireless transceiver, in accordance with certain aspects of the present disclosure.

FIG. 10 is a diagram of an environment 1000 that includes an electronic device 1002, in which aspects of the present disclosure may be practiced. In the environment 1000, the electronic device 1002 communicates with a base station 1004 through a wireless link 1006. As shown, the electronic device 902 is depicted as a smartphone. However, the electronic device 1002 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1004 communicates with the electronic device 1002 via the wireless link 1006, which may be implemented as any suitable type of wireless link. Although depicted as a base station tower of a cellular radio network, the base station 1004 may represent or be implemented as another device, such as a satellite, terrestrial broadcast tower, access point, peer-to-peer device, mesh network node, fiber optic line, another electronic device generally as described above, and so forth. Hence, the electronic device 1002 may communicate with the base station 1004 or another device via a wired connection, a wireless connection, or a combination thereof. The wireless link 1006 can include a downlink of data or control information communicated from the base station 1004 to the electronic device 1002 and an uplink of other data or control information communicated from the electronic device 1002 to the base station 1004. The wireless link 1006 may be implemented using any suitable communication protocol or standard, such as 3rd Generation Partnership Project Long-Term Evolution (3GPP LTE), 3GPP NR 5G, IEEE 802.11, IEEE 802.16, Bluetooth™, and so forth.

The electronic device 1002 includes a processor 1080 and a memory 1082. The memory 1082 may be or form a portion of a computer-readable storage medium. The processor 1080 may include any type of processor, such as an application processor or a multi-core processor, that is configured to execute processor-executable instructions (e.g., code) stored by the memory 1082. The memory 1082 may include any suitable type of data storage media, such as volatile memory (e.g., random access memory (RAM)), non-volatile memory (e.g., flash memory), optical media, magnetic media (e.g., disk or tape), and so forth. In the context of this disclosure, the memory 1082 is implemented to store instructions 1084, data 1086, and other information of the electronic device 1002, and thus when configured as or part of a computer-readable storage medium, the memory 1082 does not include transitory propagating signals or carrier waves.

The electronic device 1002 may also include input/output ports 1090. The I/O ports 1090 enable data exchanges or interaction with other devices, networks, or users or between components of the device.

The electronic device 1002 may further include a signal processor (SP) 1092 (e.g., such as a digital signal processor (DSP)). The signal processor 1092 may function similar to the processor and may be capable of executing instructions and/or processing information in conjunction with the memory 1082.

For communication purposes, the electronic device 1002 also includes a modem 1094, a wireless transceiver 1096, and an antenna (not shown). The wireless transceiver 1096 provides connectivity to respective networks and other electronic devices connected therewith using radio-frequency (RF) wireless signals and may include the transceiver circuit 900 of FIG. 9. The wireless transceiver 1096 may facilitate communication over any suitable type of wireless network, such as a wireless local area network (WLAN), a peer-to-peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Example Aspects

Implementation examples are described in the following numbered aspects.

In a first aspect, a method for fabricating an electroacoustic device, comprises: forming an acoustic device above a first region of a substrate; and forming a capacitive element above a second region of the substrate and adjacent to the acoustic device, wherein forming the capacitive element comprises: forming a protective layer above the substrate, wherein a first portion of the protective layer is above the second region of the substrate and wherein a second portion of the protective layer is above the first region of the substrate; forming a dielectric region above the protective layer, the dielectric region comprising a different material than the protective layer; and forming a first electrode above the dielectric region.

In a second aspect, in combination with the first aspect, the first portion of the protective layer is formed above a second electrode of the capacitive element.

In a third aspect, in combination with one or more of the first and second aspects, the method further comprises: forming an insulating layer; and removing a portion of the insulating layer, wherein a second electrode is formed in an opening from which the portion of the insulating layer was removed, and wherein the protective layer is formed above the second electrode.

In a fourth aspect, in combination with the third aspect, the insulating layer and the protective layer comprise a same material, and wherein a thickness of the protective layer is greater than a thickness of the insulating layer.

In a fifth aspect, in combination with one or more of the first through fourth aspects, forming the dielectric region comprises: forming the dielectric region above the first region and the second region of the substrate; and etching a portion of the dielectric region that is above the first region of the substrate.

In a sixth aspect, in combination with the fifth aspect, the second portion of the protective layer is formed above the acoustic device, the method further comprising removing the second portion of the protective layer above the acoustic device after the etching of the portion of the dielectric region that is above the first region of the substrate.

In a seventh aspect, in combination with one or more of the fifth through sixth aspects, a third portion of the protective layer is above a third region of the substrate, the third region of the substrate being between the first region and the second region of the substrate.

In an eighth aspect, in combination with the seventh aspect, further comprising removing the third portion of the protective layer after etching of a portion of the dielectric region that is above the third region of the substrate.

In a ninth aspect, in combination with one or more of the first through eighth aspects, further comprising forming a second electrode of the capacitive element above the second region of the substrate wherein the first portion of the protective layer is formed above the second electrode of the capacitive element.

In a tenth aspect, in combination with one or more of the first through ninth aspects, further comprising: removing the second portion of the protective layer that is above the first region of the substrate; and forming an insulating layer above the first region of the substrate after the removing the second portion of the protective layer.

In an eleventh aspect, in combination with the tenth aspect, the insulating layer is formed prior to forming the acoustic device.

In a twelfth aspect, in combination with the eleventh aspect, forming the acoustic device comprises: etching one or more portions of the other protective layer to form one or more openings in the protective layer; and forming an interdigital transducer (IDT) in the one or more openings.

In a thirteenth aspect, in combination with the twelfth aspect, further comprising forming a third electrode above a busbar of the IDT.

In a fourteenth aspect, in combination with one or more of the first through thirteenth aspects, further comprising forming another acoustic device having a top electrode above the second region of the substrate, wherein the first portion of the protective layer is formed above a second electrode of the capacitive element, and wherein the second electrode of the capacitive element is the top electrode of the other acoustic device.

In a fifteenth aspect, in combination with the fourteenth aspect, the first portion of the protective layer is formed above the other acoustic device.

In a sixteenth aspect, in combination with one or more of the fourteenth through fifteenth aspects, a portion of the first electrode is formed adjacent to a lateral side of the top electrode.

In a seventeenth aspect, in combination with one or more of the fourteenth through sixteenth aspects, further comprising: forming another protective layer above the acoustic device and the first electrode; and trimming a portion of the other protective layer that is above the acoustic device.

In an eighteenth aspect, in combination with the seventeenth aspect, the other protective layer is formed using a plasma enhanced chemical vapor deposition (PECVD) process.

In a nineteenth aspect, in combination with one or more of the first through eighteenth aspects, the substrate comprises a piezoelectric substrate.

In a twentieth aspect, alone or in combination with one or more of the first through nineteenth aspects, the protective layer comprises an aluminum oxide ($Al_2O_3$) layer or an aluminum nitride (AlN) layer.

In a twenty-first aspect, in combination with one or more of the first through twentieth aspects, the protective layer is formed using an atomic layer deposition (ALD) process.

In a twenty-second aspect, in combination with one or more of the first through twenty-first aspects, the protective layer comprises an etch stop layer configured to prevent dry etching beneath the etch stop layer.

In a twenty-third aspect, an apparatus for signal processing, comprising: an acoustic device disposed above a first region of a substrate; and a capacitive element disposed above a second region of the substrate and adjacent to the acoustic device, wherein the capacitive element comprises: a first electrode; a protective layer above the substrate, wherein a first portion of the protective layer is disposed above the second region of the substrate; a dielectric region disposed above the protective layer and the first electrode, the dielectric region comprising a different material than the protective layer; and a second electrode disposed above the dielectric region.

In a twenty-fourth aspect, in combination with the twenty-third aspect, the first portion of the protective layer is disposed above the first electrode.

In a twenty-fifth aspect, in combination with one or more of the twenty-third through twenty-fourth aspects, the acoustic device comprises an interdigital transducer (IDT).

In a twenty-sixth aspect, in combination with the twenty-fifth aspect, a third electrode is disposed above a busbar of the IDT.

In a twenty-seventh aspect, in combination with one or more of the twenty-third through twenty-sixth aspects, the substrate comprises a piezoelectric substrate.

In a twenty-eighth aspect, in combination with one or more of the twenty-third through twenty-seventh aspects, the protective layer comprises an aluminum oxide ($Al_2O_3$) layer.

In a twenty-ninth aspect, in combination with one or more of the twenty-third through twenty-seventh aspects, the protective layer comprises an aluminum nitride (AlN) layer.

In a thirtieth aspect, in combination with one or more of the twenty-third through twenty-ninth aspects, the protective layer comprises an etch stop layer configured to prevent dry etching beneath the etch stop layer.

Additional Considerations

The various operations of methods described above may be performed by any suitable means capable of performing the corresponding functions. The means may include various hardware and/or software component(s) and/or module(s), including, but not limited to a circuit, an application-specific integrated circuit (ASIC), or processor.

By way of example, an element, or any portion of an element, or any combination of elements described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoCs), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuit.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A method for fabricating an electroacoustic device, comprising:
   forming an acoustic device above a first region of a substrate; and
   forming a capacitive element above a second region of the substrate and adjacent to the acoustic device, wherein forming the capacitive element comprises:

forming a protective layer above the substrate, wherein a first portion of the protective layer is above the second region of the substrate and wherein a second portion of the protective layer is above the first region of the substrate;

forming a dielectric region above the protective layer, the dielectric region comprising a different material than the protective layer; and forming a first electrode above the dielectric region.

2. The method of claim 1, wherein the first portion of the protective layer is formed above a second electrode of the capacitive element.

3. The method of claim 1, further comprising:
forming an insulating layer; and
removing a portion of the insulating layer, wherein a second electrode is formed in an opening from which the portion of the insulating layer was removed, and wherein the protective layer is formed above the second electrode.

4. The method of claim 3, wherein the insulating layer and the protective layer comprise a same material, and wherein a thickness of the protective layer is greater than a thickness of the insulating layer.

5. The method of claim 1, wherein forming the dielectric region comprises:
forming the dielectric region above the first region and the second region of the substrate; and
etching a portion of the dielectric region that is above the first region of the substrate.

6. The method of claim 5, wherein the second portion of the protective layer is formed above the acoustic device, the method further comprising removing the second portion of the protective layer above the acoustic device after the etching of the portion of the dielectric region that is above the first region of the substrate.

7. The method of claim 5, wherein a third portion of the protective layer is above a third region of the substrate, the third region of the substrate being between the first region and the second region of the substrate.

8. The method of claim 7, further comprising removing the third portion of the protective layer after etching of a portion of the dielectric region that is above the third region of the substrate.

9. The method of claim 1, further comprising forming a second electrode of the capacitive element above the second region of the substrate, wherein the first portion of the protective layer is formed above the second electrode of the capacitive element.

10. The method of claim 1, further comprising:
removing the second portion of the protective layer that is above the first region of the substrate; and
forming an insulating layer above the first region of the substrate after the removing the second portion of the protective layer.

11. The method of claim 10, wherein the insulating layer is formed prior to forming the acoustic device.

12. The method of claim 11, wherein forming the acoustic device comprises:
etching one or more portions of the insulating layer to form one or more openings in the insulating layer; and
forming an interdigital transducer (IDT) in the one or more openings.

13. The method of claim 12, further comprising forming a third electrode above a busbar of the IDT.

14. The method of claim 1, further comprising forming another acoustic device having a top electrode above the second region of the substrate, wherein the first portion of the protective layer is formed above a second electrode of the capacitive element, and wherein the second electrode of the capacitive element is the top electrode of the other acoustic device.

15. The method of claim 14, wherein the first portion of the protective layer is formed above the other acoustic device.

16. The method of claim 14, wherein a portion of the first electrode is formed adjacent to a lateral side of the top electrode.

17. The method of claim 14, further comprising:
forming another protective layer above the acoustic device and the first electrode; and
trimming a portion of the other protective layer that is above the acoustic device.

18. The method of claim 17, wherein the other protective layer is formed using a plasma enhanced chemical vapor deposition (PECVD) process.

19. The method of claim 1, wherein the substrate comprises a piezoelectric substrate.

20. The method of claim 1, wherein the protective layer comprises an aluminum oxide ($Al_2O_3$) layer or an aluminum nitride (AlN) layer.

21. The method of claim 1, wherein the protective layer is formed using an atomic layer deposition (ALD) process.

22. The method of claim 1, wherein the protective layer comprises an etch stop layer configured to prevent dry etching beneath the etch stop layer.

23. An apparatus for signal processing, comprising:
an acoustic device disposed above a first region of a substrate; and
a capacitive element disposed above a second region of the substrate and adjacent to the acoustic device, wherein the capacitive element comprises:
a first electrode;
a protective layer disposed above the substrate, wherein a first portion of the protective layer is disposed above the second region of the substrate;
a dielectric region disposed above the protective layer and the first electrode, the dielectric region comprising a different material than the protective layer; and
a second electrode disposed above the dielectric region.

24. The apparatus of claim 23, wherein the first portion of the protective layer is disposed above the first electrode.

25. The apparatus of claim 23, wherein the acoustic device comprises an interdigital transducer (IDT).

26. The apparatus of claim 25, wherein a third electrode is disposed above a busbar of the IDT.

27. The apparatus of claim 23, wherein the substrate comprises a piezoelectric substrate.

28. The apparatus of claim 23, wherein the protective layer comprises an aluminum oxide ($Al_2O_3$) layer.

29. The apparatus of claim 23, wherein the protective layer comprises an aluminum nitride (AlN) layer.

30. The apparatus of claim 23, wherein the protective layer comprises an etch stop layer configured to prevent dry etching beneath the etch stop layer.

* * * * *